(12) United States Patent
Huang et al.

(10) Patent No.: US 11,532,712 B2
(45) Date of Patent: Dec. 20, 2022

(54) INTERCONNECT STRUCTURES FOR SEMICONDUCTOR DEVICES AND METHODS OF MANUFACTURING THE SAME

(71) Applicant: Taiwan Semiconductor Manufacturing Company Limited, Hsinchu (TW)

(72) Inventors: Yu-Lien Huang, Jhubei (TW); Ching-Feng Fu, Taichung (TW); Guan-Ren Wang, Hsinchu (TW); Che-Ming Hsu, Hsinchu (TW)

(73) Assignee: TAIWAN SEMICONDUCTOR MANUFACTURING COMPANY LIMITED, Hsinchu (TW)

(*) Notice: Subject to any disclaimer, the term of this patent is extended or adjusted under 35 U.S.C. 154(b) by 39 days.

(21) Appl. No.: 17/166,552

(22) Filed: Feb. 3, 2021

(65) Prior Publication Data
US 2021/0343844 A1   Nov. 4, 2021

Related U.S. Application Data

(60) Provisional application No. 63/017,120, filed on Apr. 29, 2020.

(51) Int. Cl.
| | | |
|---|---|---|
| *H01L 29/40* | (2006.01) | |
| *H01L 21/311* | (2006.01) | |
| *H01L 29/78* | (2006.01) | |
| *H01L 29/66* | (2006.01) | |
| *H01L 29/417* | (2006.01) | |

(52) U.S. Cl.
CPC ...... *H01L 29/401* (2013.01); *H01L 21/31116* (2013.01); *H01L 21/31144* (2013.01); *H01L 29/41791* (2013.01); *H01L 29/66795* (2013.01); *H01L 29/7851* (2013.01)

(58) Field of Classification Search
CPC .......................... H01L 29/401; H01L 21/31144
See application file for complete search history.

(56) References Cited

U.S. PATENT DOCUMENTS

| | | | |
|---|---|---|---|
| 10,121,675 B2 | 11/2018 | Lee et al. | |
| 10,566,246 B1 * | 2/2020 | Wu | ............ H01L 21/02068 |
| 10,566,421 B2 | 2/2020 | Zhou | |
| 2015/0228762 A1 * | 8/2015 | He | ............ H01L 29/42372 |
| | | | 438/283 |
| 2017/0221892 A1 | 8/2017 | Li | |
| 2020/0043945 A1 | 2/2020 | Kim et al. | |
| 2020/0058563 A1 | 2/2020 | Wu et al. | |
| 2020/0098888 A1 | 3/2020 | Lin et al. | |

* cited by examiner

*Primary Examiner* — Farun Lu
(74) *Attorney, Agent, or Firm* — Foley & Lardner LLP

(57) ABSTRACT

A method for making a semiconductor device includes forming a first patterned structure over an interlayer dielectric. The interlayer dielectric overlays a first source/drain structure and a second source/drain structure. The first patterned structure extends along a first lateral direction and a vertical projection of the first patterned structure is located between the first and second source/drain structures along a second lateral direction perpendicular to the first lateral direction. The method includes reducing a width of the first patterned structure that extends along the second lateral direction. The method includes forming, based on the first patterned structure having the reduced width, contact holes that expose the first source/drain structure and the second source/drain structure, respectively.

20 Claims, 31 Drawing Sheets

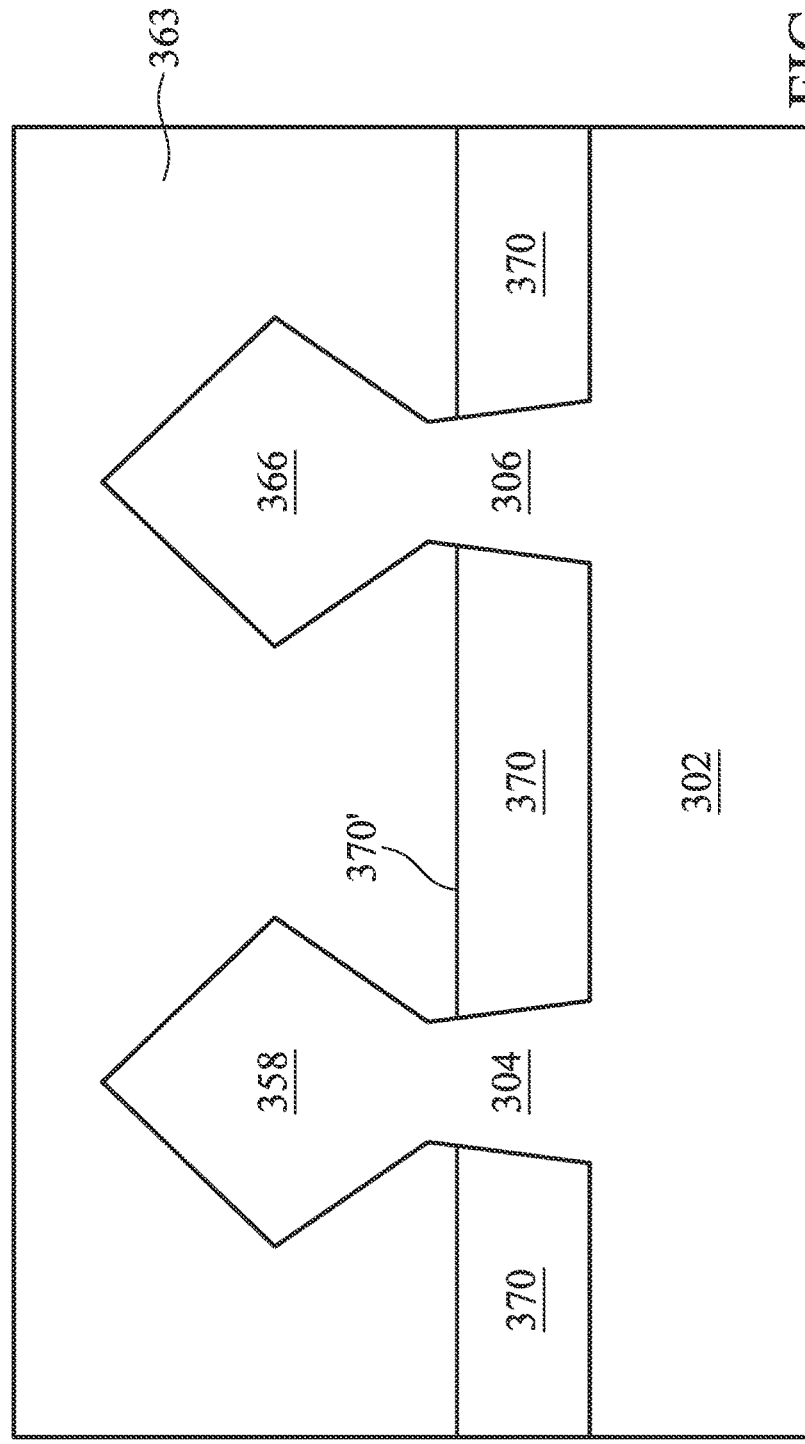

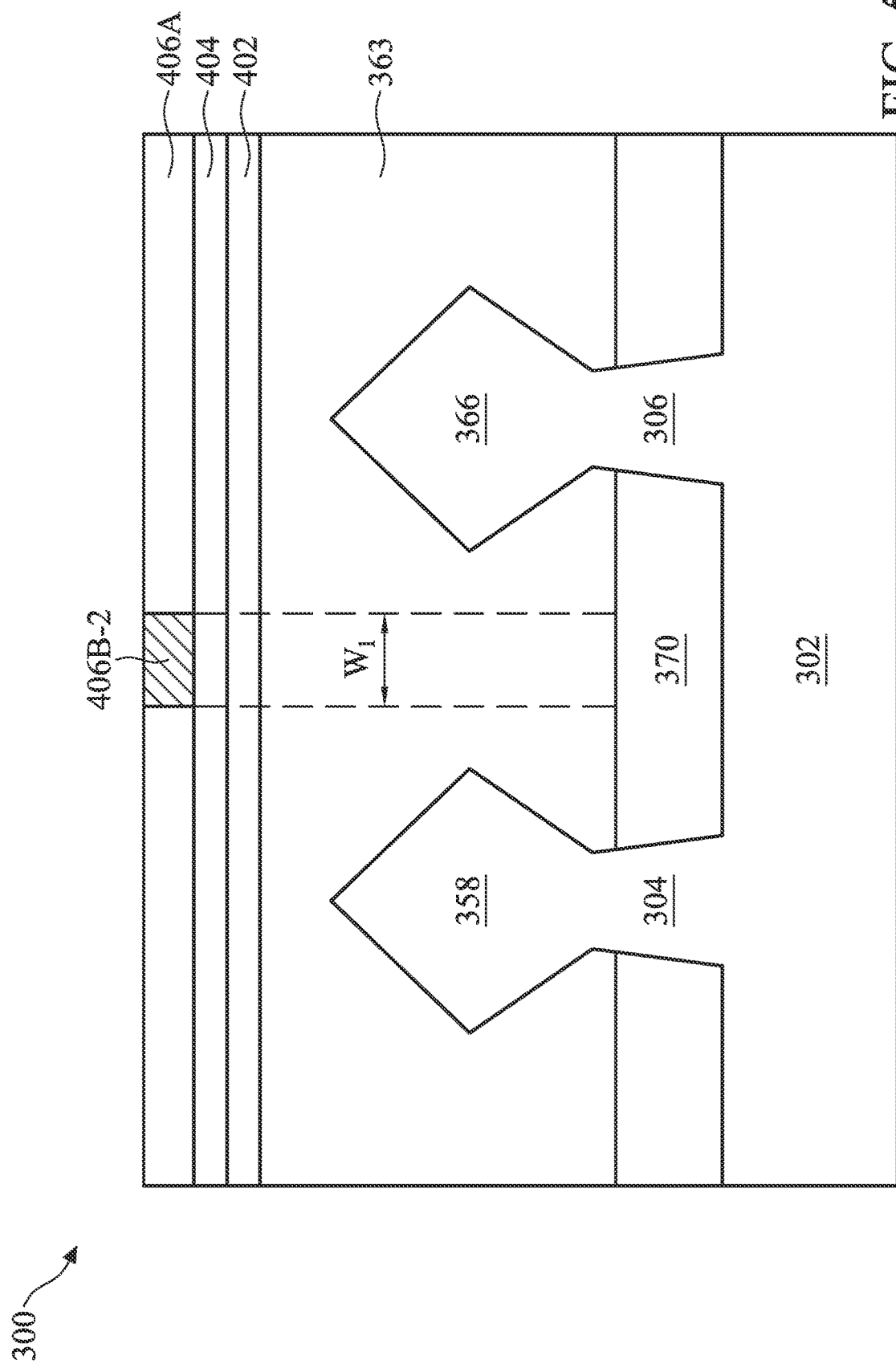

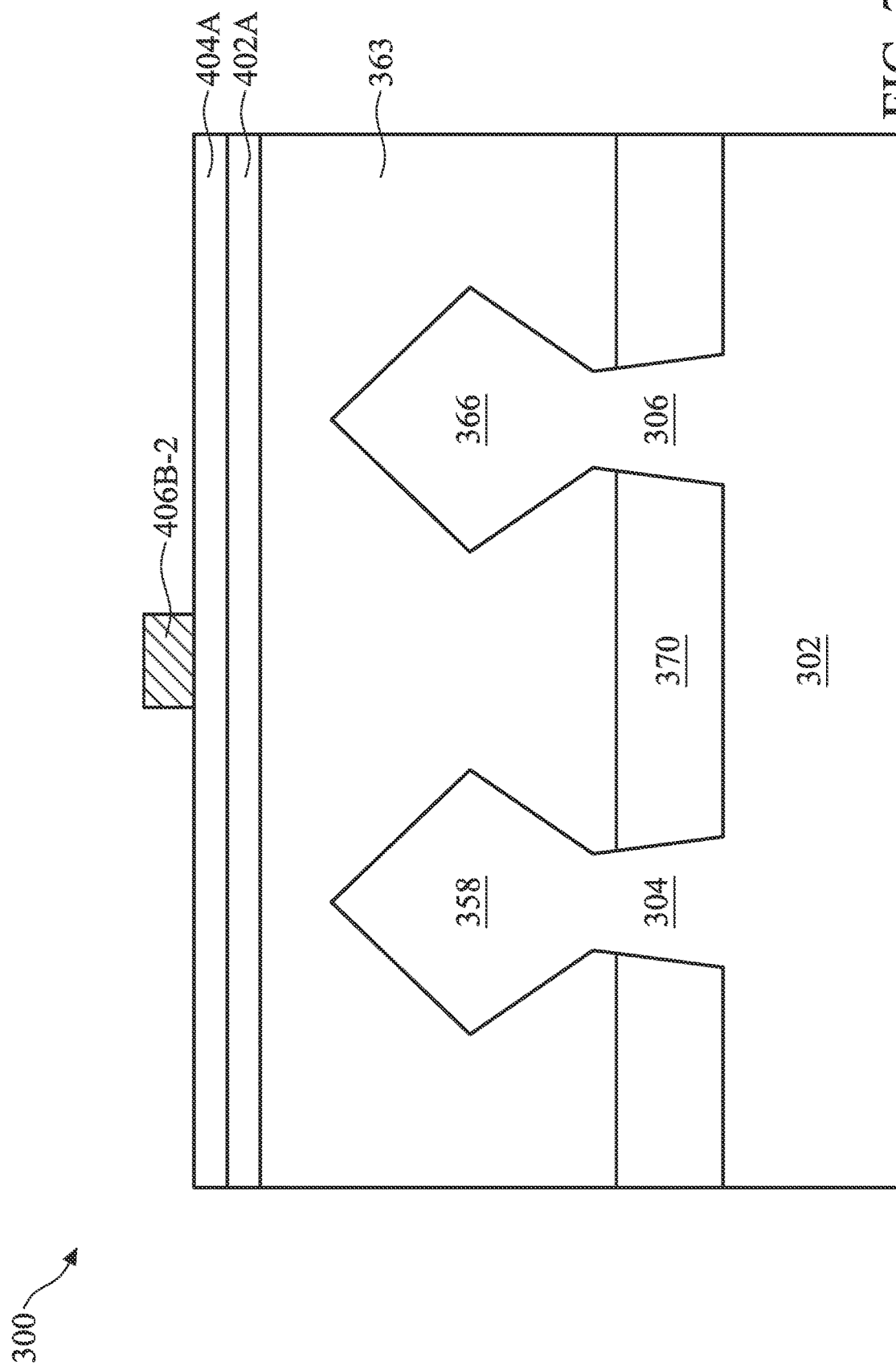

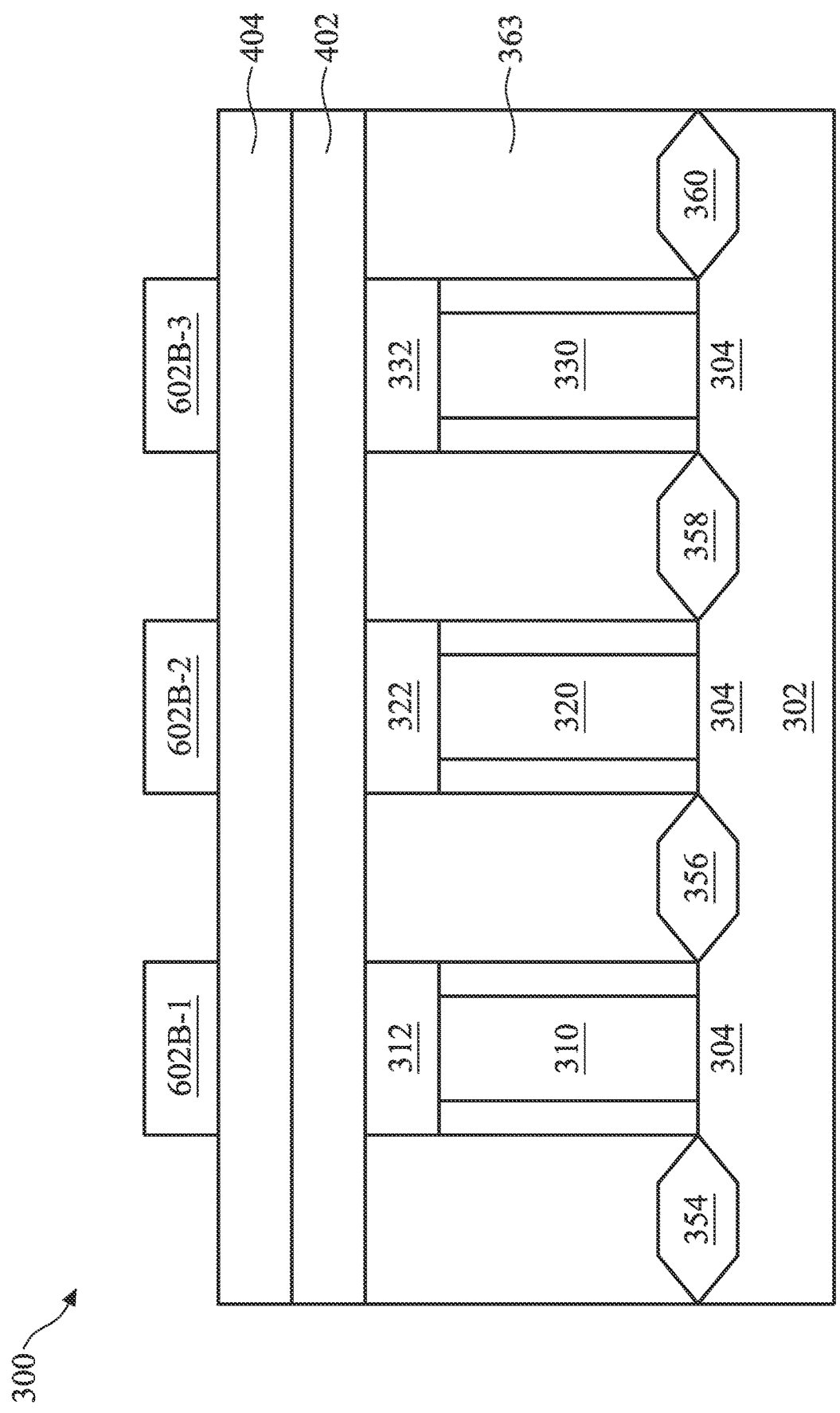

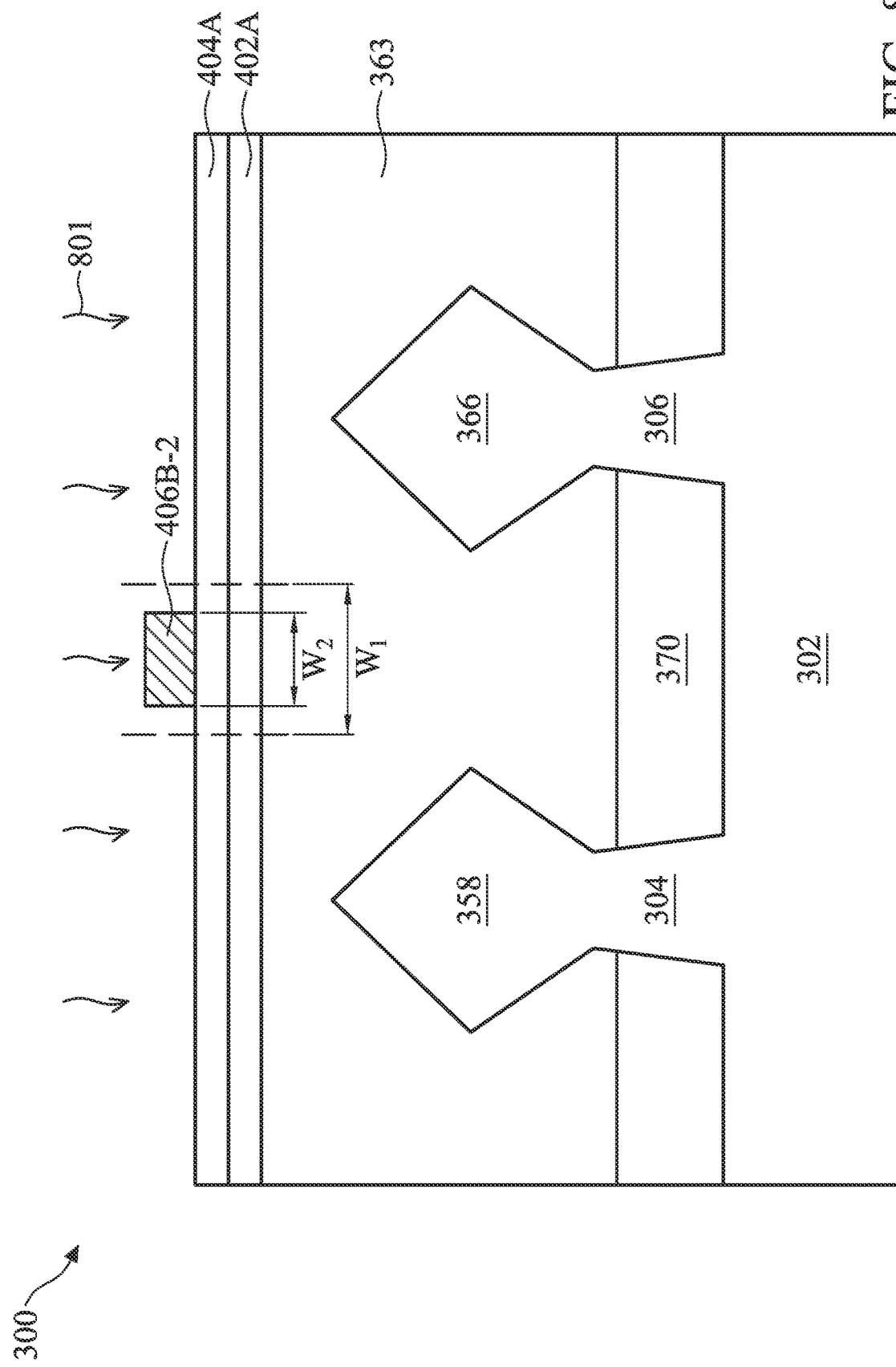

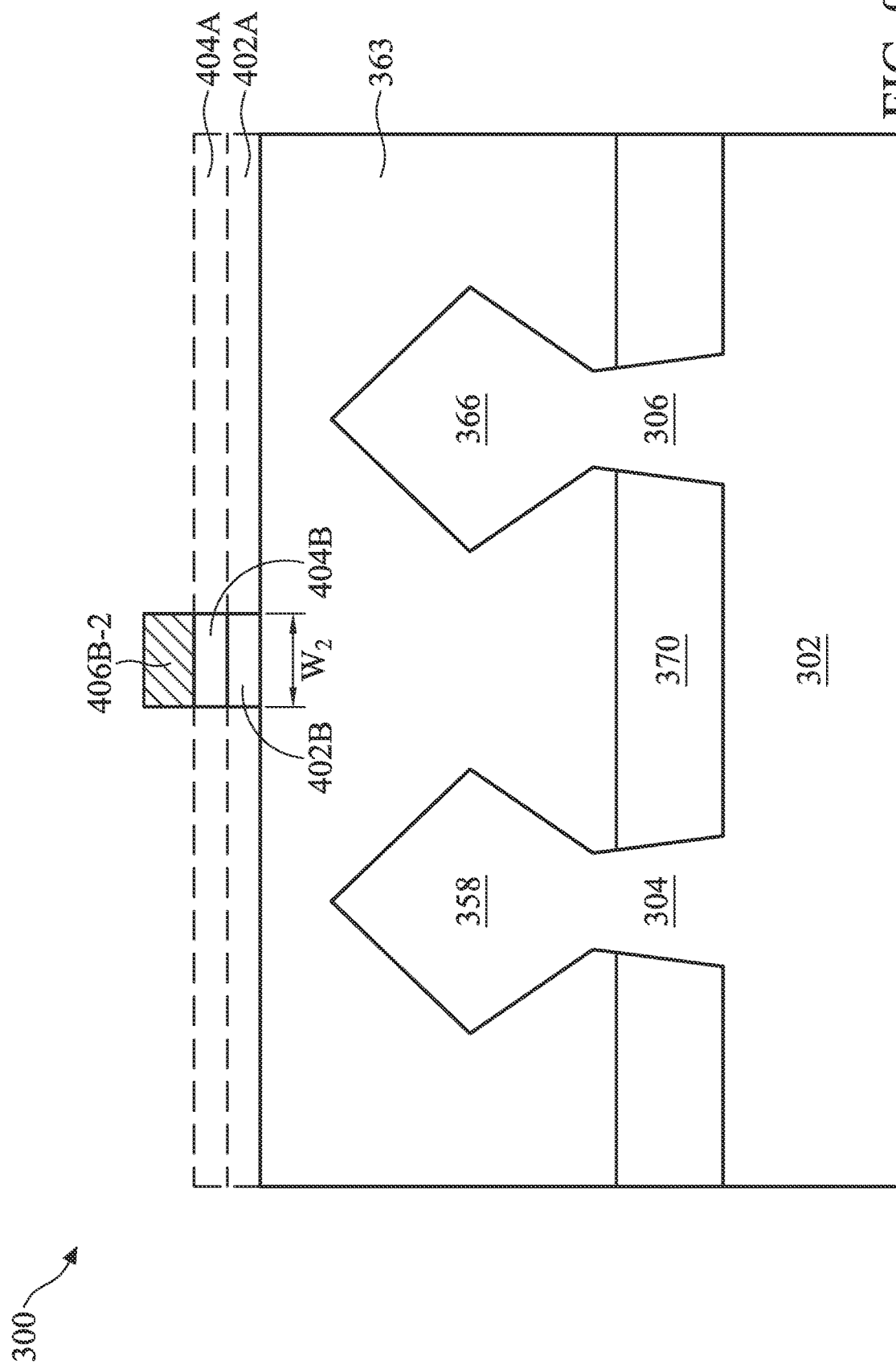

United States Patent US 11,532,712 B2

INTERCONNECT STRUCTURES FOR SEMICONDUCTOR DEVICES AND METHODS OF MANUFACTURING THE SAME

CROSS-REFERENCE TO RELATED APPLICATION

The present application claims priority to U.S. Provisional Application No. 63/017,120, filed on Apr. 29, 2020, which is incorporated by reference herein in its entirety.

BACKGROUND

This disclosure relates generally to a semiconductor device, and in some embodiments, to interconnect structures for a transistor device.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3B, 4B, 5B, 6B, 7B, 8B, 9B, 10B, and 11B illustrate cross-sectional views of the example FinFET device, cut along a first cross-section, that correspond to FIGS. 3A-11A, respectively, in accordance with some embodiments.

FIGS. 3C, 4C, 5C, 6C, 7C, 8C, 9C, 10C, and 11C illustrate cross-sectional views of the example FinFET device, cut along a second cross-section, that correspond to FIGS. 3A-11A, respectively, in accordance with some embodiments.

DETAILED DESCRIPTION

Figure 1:
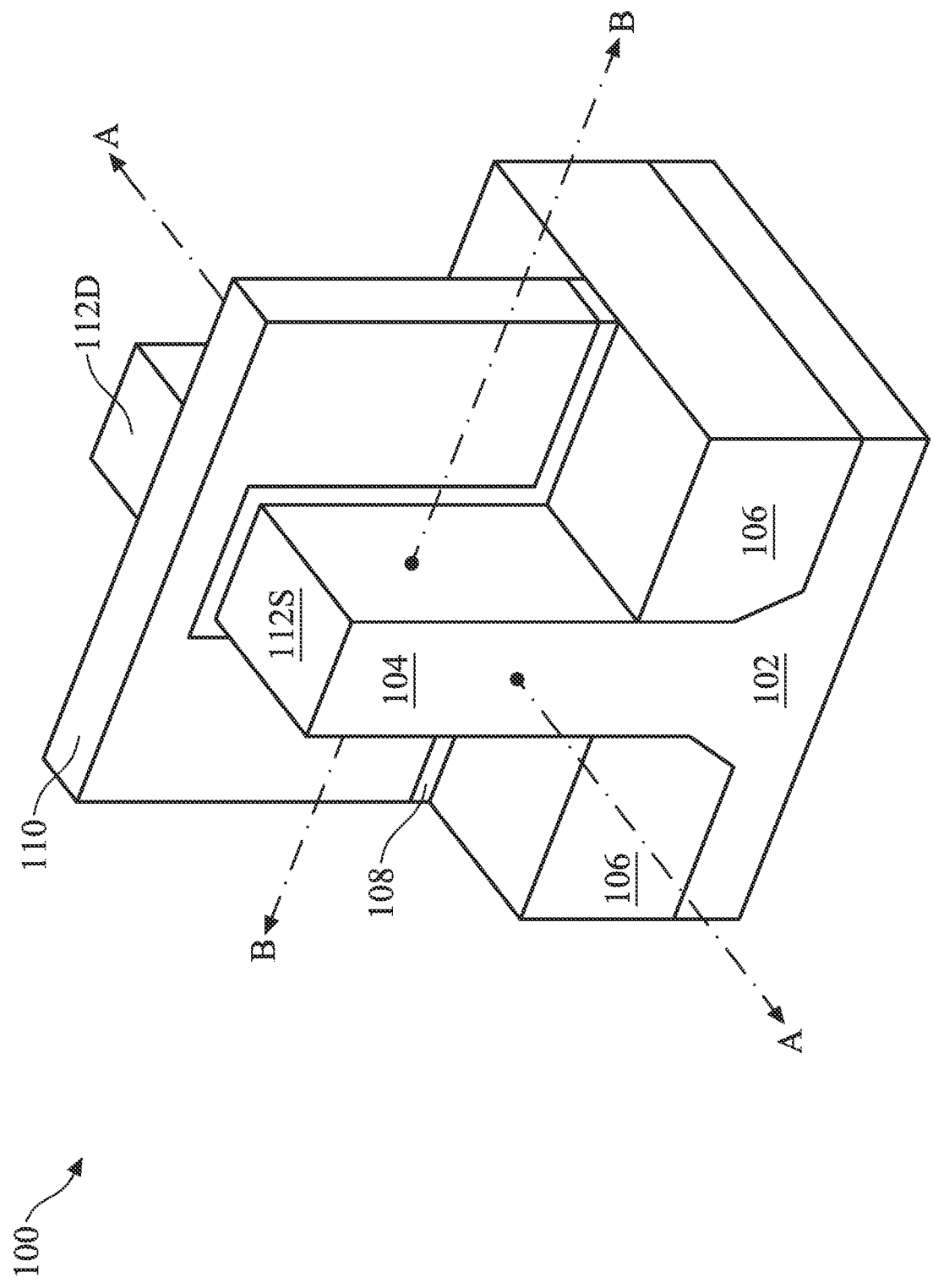
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

IC processing often utilizes a series of patterning processes to produce a number of IC features. For example, existing processing utilizes a patterned structure to define a dielectric spacing between respective interconnect structures for adjacent IC features (e.g., source/drain structures). It is generally desired to have such interconnect structure present a relative greater length or width (in a direction along which the interconnect structures are aligned), as their respective contact resistances (typically referred to as "$R_c$") can be accordingly reduced. By shrinking a critical dimension of the patterned structure (accordingly a critical dimension of the dielectric spacing), the length of the interconnect structures may be increased. However, in logic areas (e.g., static random access memory (SRAM) areas), it has become increasingly challenging to shrink the critical dimension of the dielectric spacing (the patterned structure).

The present disclosure provides various embodiments of forming a dielectric spacing between two adjacent interconnect structures. In some embodiments, the two interconnect structures may be electrically coupled to two adjacent source/drain structures, respectively. A width of the dielectric spacing (e.g., a distance between those two interconnect structures) can be defined by a patterned structure. The patterned structure can be trimmed to have a narrower width, which in turn can enlarge a critical dimension of each of the interconnect structures. Thus, respective contact resistances of the interconnect structures can thus be advantageously reduced.

The present disclosure is directed to, but not otherwise limited to, a fin-like field-effect transistor (FinFET) device. Such a FinFET device has a three-dimensional structure that includes a fin protruding from a substrate. A gate structure, configured to control the flow of charge carriers within a conduction channel of the FinFET device, wraps around the fin. For example, in a tri-gate FinFET device, the gate structure wraps around three sides of the fin, thereby forming conduction channels on three sides of the fin. It should be notes that other configurations of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices. The following disclosure will continue with a FinFET example to illustrate various embodiments of the present invention. It is understood, however, that the application should not be limited to a particular type of semiconductor device.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108, which can sometimes collectively referred to as an active gate structure. Source/drain regions or structures, 112S and 112D, are formed in (or extended from) the fin 104 and on opposing sides of the active gate structure. FIG. 1 is provided as a reference to illustrate a number of cross-sections in subsequent figures. For example, cross-section B-B extends along a longitudinal axis of the gate 110 of the FinFET device 100, and across one of the source/drain structures 112S/112D. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
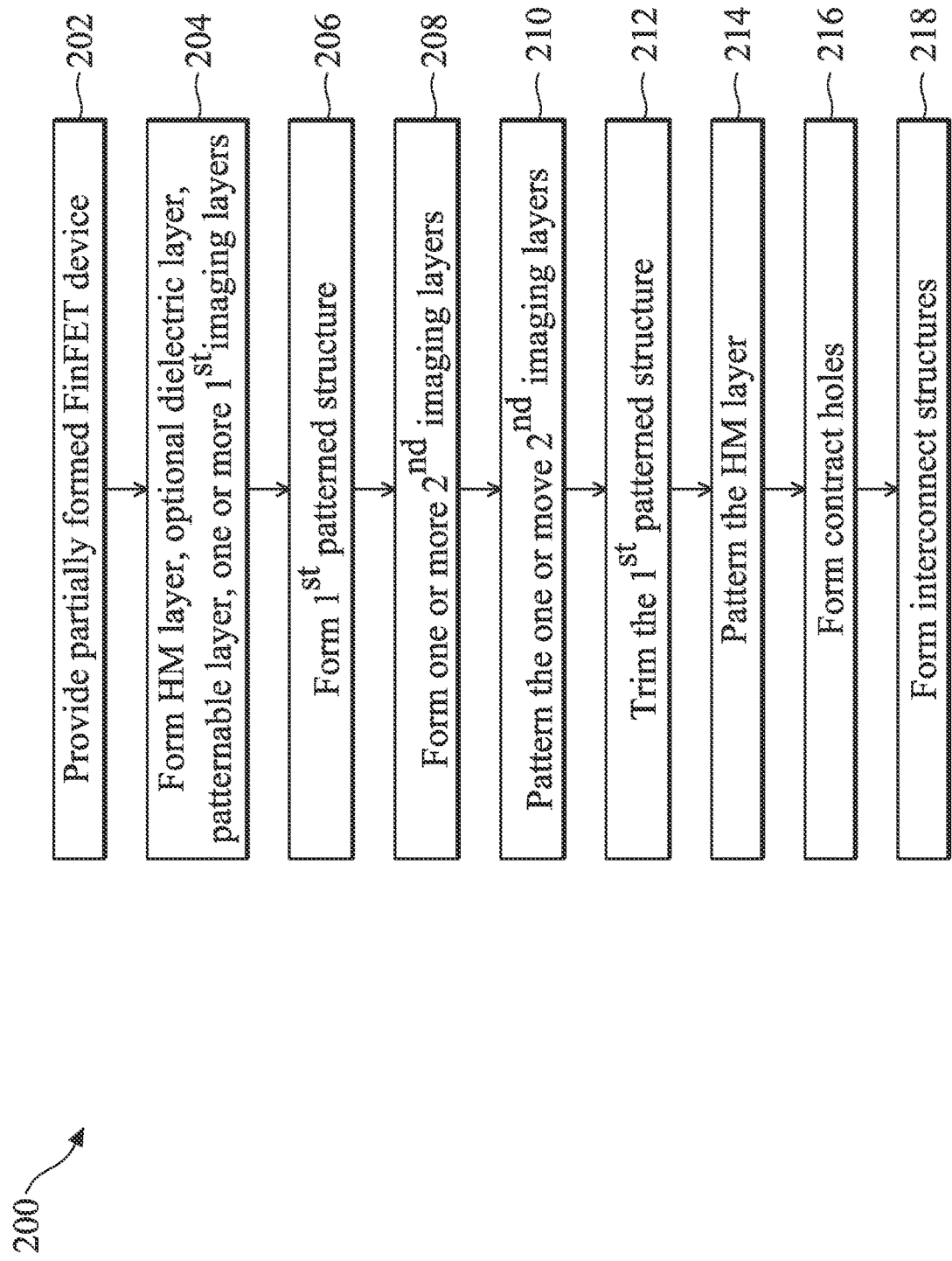
FIG. 2 illustrates a flow chart of an example method for making interconnect structures for a transistor device, in accordance with some embodiments.

FIG. 2 illustrates a flowchart of a method 200 to form interconnect structures for a transistor device, according to one or more embodiments of the present disclosure. For example, at least some of the operations of the method 200 can be used to form a FinFET device (e.g., FinFET device 100). It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with top views of the example FinFET device at one of the various fabrication stages as shown in FIGS. 3A, 4A, 5A, 6A, 7A, 8A, 9A, 10A, and 11A and cross-sectional views of an example FinFET device at various fabrication stages as shown in FIGS. 3B, 3C, 4B, 4C, 5B, 5C, 6B, 6C, 7B, 7C, 8B, 8C, 9B, 9C, 10B, 10C, 11B, and 11C, respectively, which will be discussed in further detail below.

In brief overview, the method 200 starts with operation 202 of providing a partially formed FinFET device. The method 200 continues to operation 204 of forming one or more first imaging layers that include a pattern for forming a first patterns structure. The method 200 continues to operation 206 of forming the first patterned structure. The method 200 continues to operation 208 of forming one or more second imaging layers that include a pattern for forming interconnect structures. The method 200 continues to operation 210 of patterning the one or more second imaging layers to expose a portion of the first patterned structure. The method 200 continues to operation 212 of trimming the first patterned structure. The method 200 continues to operation 214 of patterning the hard mask layer to form a second patterned structure. The method 200 continues to operation 216 of forming contact holes. The method 200 continues to operation 218 of forming the interconnect structures in the contact holes.

As mentioned above, FIGS. 3A-11C each illustrate, in either a cross-sectional view or top view, a portion of a FinFET device 300 at various fabrication stages of the method 200 of FIG. 2. The FinFET device 300 is substantially similar to the FinFET device 100 shown in FIG. 1, but with multiple fins and multiple active gate structures. For example, FIGS. 3A, 4A, 5A, 6A, 7A, 8A, 9A, 10A, and 11A each illustrate a top view of the FinFET device 300; FIGS. 3B, 4B, 5B, 6B, 7B, 8B, 9B, 10B, and 11B each illustrate a cross-sectional view of the FinFET device 300 along cross-section A-A (as indicated in FIG. 1); and FIGS. 3C, 4C, 5C, 6C, 7C, 8C, 9C, 10C, and 11C each illustrate a cross-sectional view of the FinFET device 300 along cross-section B-B (as indicated in FIG. 1). Although FIGS. 3A-11C illustrate the FinFET device 300, it is understood the FinFET device 300 may include a number of other devices such as inductors, fuses, capacitors, coils, etc., which are not shown in FIGS. 3A-11C, for purposes of clarity of illustration.

Figure 3A:
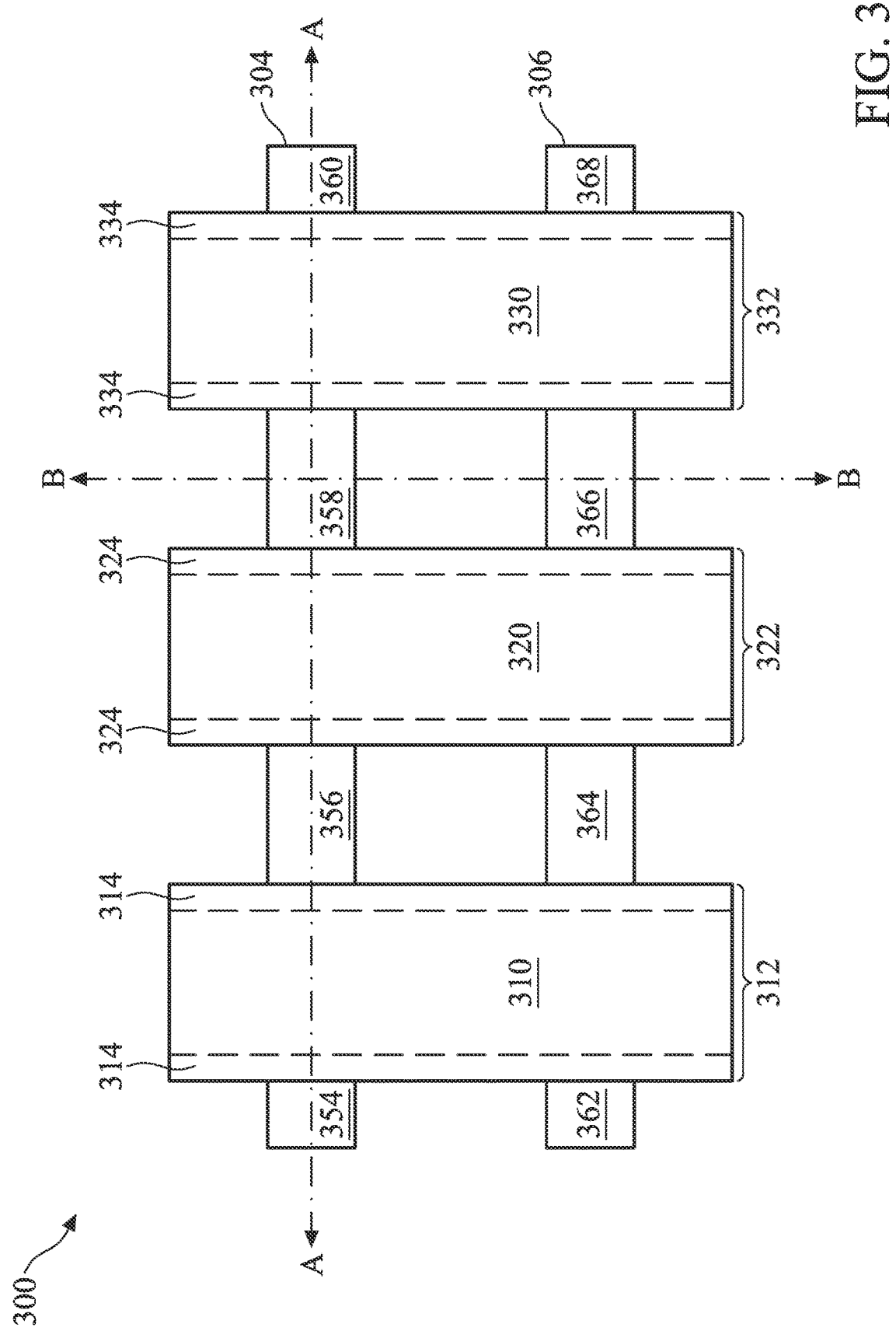
FIGS. 3A, 4A, 5A, 6A, 7A, 8A, 9A, 10A, and 11A illustrate top views of an example FinFET device during various fabrication stages, made by the method of FIG. 2, in accordance with some embodiments.
Figure 3B:
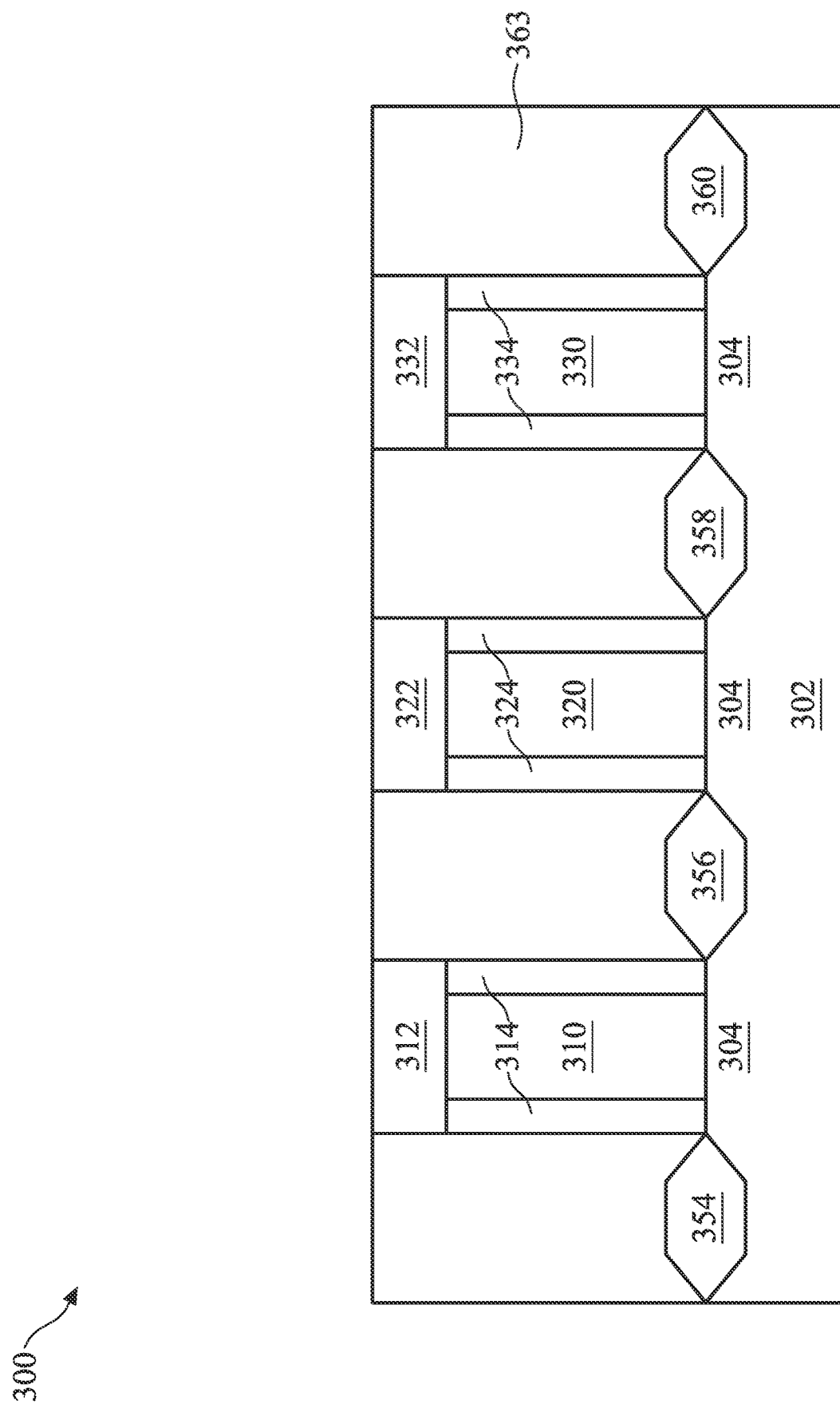

Corresponding to operation 202 of FIG. 2, FIG. 3A is a top view of the FinFET device 300 that has been partially formed at one of the various stages of fabrication. FIGS. 3B and 3C illustrate corresponding cross-sectional view of FIG. 3A cut along cross-section A-A and cross-section B-B, respectively.

As shown in FIG. 3A, such a partially formed FinFET device 300 includes two fins, 304 and 306, and three active gate structures, 310, 320, and 330. It should be understood that the FinFET device 300 can include any number of fins and any number of active gate structures while remaining within the scope of the present disclosure. In various embodiments, the fins 304-306 each extend along a first lateral direction, and the active gate structures 310-330 each extend along a second lateral direction (e.g., perpendicular to the first lateral direction) and traverse the fins 304-306. Along its opposite sides, each of the active gate structures includes a (gate) spacer. For example, a gate spacer 314 includes two portions that extend along sides of the active gate structure 310, respectively; a gate spacer 324 includes two portions extend along sides of the active gate structure 320, respectively; and a gate spacer 334 includes two portions that extend along sides of the active gate structure 330, respectively.

Each of the fins can be overlaid by one or more active gate structures (and respective gate spacers) to define a number of source/drain structures. For example, the active gate structure 310 (together with the gate spacer 314) overlays a first portion of the fin 304 to define source/drain structures 354 and 356; the active gate structure 310 (together with the gate spacer 324) overlays a first portion of the fin 306 to define source/drain structures 362 and 364; the active gate structure 320 (together with the gate spacer 334) overlays a second portion of the fin 304 to define source/drain structures 356 and 358; the active gate structure 320 (together with the gate spacer 324) overlays a second portion of the fin 306 to define source/drain structures 364 and 366; the active gate structure 330 (together with the gate spacer 334) overlays a third portion of the fin 304 to define source/drain structures 358 and 360; and the active gate structure 330 (together with the gate spacer 334) overlays a third portion of the fin 306 to define source/drain structures 366 and 368.

Each of the overlaid portions of the fins can have two ends coupled to one or more respective source/drain structures (e.g., a pair of source/drain structures). For example, the source/drain structures 354 and 356 are coupled to ends of the first overlaid portion of the fin 304, respectively; the source/drain structures 356 and 358 are coupled to ends of the second overlaid portion of the fin 304, respectively; the source/drain structures 358 and 360 are coupled to ends of the third overlaid portion of the fin 304, respectively; the source/drain structures 362 and 364 are coupled to ends of the first overlaid portion of the fin 306, respectively; the source/drain structures 364 and 366 are coupled to ends of the second overlaid portion of the fin 306, respectively; and the source/drain structures 366 and 368 are coupled to ends of the third overlaid portion of the fin 306, respectively.

To further illustrate the FinFET device 300, FIG. 3B illustrates its cross-sectional view cut along cross-section A-A, which extends along a lengthwise direction of the fin 304; and FIG. 3C illustrates its cross-sectional view cut along cross-section B-B, which traverses the source/drain structures 358 and 366. As shown in FIG. 3C, the fins 304 and 306, which protrude from a substrate 302, are separated apart from each other by an isolation structure 370 (sometime referred to as a shallow trench isolation (STI)). The source/drain structures 358 and 366 are coupled to the fins 304 and 306, respectively. An interlayer dielectric (ILD) 363 overlays the source/drain structures while extending along sidewalls of each of the active gate structures 310-330, as shown in FIG. 3B. Each of the active gate structures 310-330 can include a gate dielectric (which can include one or more high-k dielectric layers) and a gate metal over the gate dielectric (which can include one or more metal layers). Such a gate dielectric and a gate metal are collectively shown as the active gate structure for clarity of illustration. Further, each of the active gate structures (and respective gate spacers) can be overlaid by a sacrificial helmet structure. For example in FIG. 3B, the active gate structure 310 (and the gate spacer 314) are overlaid by a sacrificial helmet structure 312; the active gate structure 320 (and the gate spacer 324) are overlaid by a sacrificial helmet structure 322; and the active gate structure 330 (and the gate spacer 334) are overlaid by a sacrificial helmet structure 332.

Operations performed to form the FinFET device 300 shown in FIGS. 3A-C will be briefly discussed as follows: providing the substrate 302; forming the fins 304-306; forming the isolation structures 370; forming dummy gate structures; forming the gate spacers 314-334 along respective sidewalls of each of the dummy gate structures; forming the source/drain structures 354-368; forming the ILD 363; and replacing the dummy gate structures with the active gate structures 310-330. In some embodiments, subsequently to forming the active gate structures 310-330, an upper portion of each of the active gate structures (and the gate spacer extending along its sidewalls) is removed (or etched back) to form a recess, which can be filled with the respective sacrificial helmet structure that is configured to protect the active gate structure while forming contact holes for the source/drain structures.

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Next, the fins 304-306 are formed by patterning the substrate 302 using, for example, photolithography and etching techniques. For example, a mask layer, such as a pad oxide layer and an overlying pad nitride layer, is formed over the substrate 302. The pad oxide layer may be a thin film comprising silicon oxide formed, for example, using a thermal oxidation process. The pad oxide layer may act as an adhesion layer between the substrate 302 and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example. The fins 304-306 may be patterned by any suitable method. For example, the fins 304-306 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Next, the isolation structures 370, which are formed of an insulation material, are formed to electrically isolate neighboring fins (e.g., the fins 304 and 306) from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form a top surface of the isolation structures 370 and a top surface of the fins 304-306 that are coplanar (not shown). The above-mentioned patterned mask may also be removed by the planarization process.

Next, the isolation structures are recessed to form shallow trench isolation (STI) 370, as shown in FIG. 3C. The isolation structures 370 are recessed such that the fins 304-306 can protrude from between neighboring STIs. Such protruded fins 304-306 can function as the conduction channels of a first set of transistors and a second set of transistors, respectively. Respective top surfaces 370' of the STIs 370 may have a flat surface (as illustrated), a convex surface, a concave surface (such as dishing), or combinations thereof. The top surfaces of the STIs 370 may be formed flat, convex, and/or concave by an appropriate etch. The STIs 370 may be recessed using an acceptable etching process, such as one that is selective to the material of the isolation structures. For example, a dry etch or a wet etch using dilute hydrofluoric (DHF) acid may be performed to recess the isolation structures.

Next, a number of dummy gate structures (e.g., three dummy gate structures in the present example) are formed to overlay a respective portion of each of the fins 304-306. The dummy gate structures may also have a lengthwise direction substantially perpendicular to the lengthwise direction of the fins 304-306. The gate spacers 314-334 are then formed along the sidewalls of each of the dummy gate structures. The gate spacers 314-334 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacers 314-334.

Next, the source/drain structures 354-368 are formed in recesses of the fins 304-306, respectively, that are formed on respective opposite sides of each of the dummy gate structures. The recesses are formed by, e.g., an anisotropic etching process using the dummy gate structures as an etching mask, in some embodiments, although any other suitable etching process may also be used.

The source/drain structures 354-368 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIG. 3B (with the source/drain structures 354-360 as a representative example), the epitaxial source/drain structures may each have a surface raised from a top surface of the fin 304 (e.g. raised above the non-recessed portions of the fin 304) and may have facets. In some embodiments, the source/drain structures of the adjacent fins may merge to form a continuous epitaxial source/drain region (not shown). In some embodiments, the source/drain structures of the adjacent fins may not merge together and remain separate source/drain structures (as shown in FIG. 3C). When the resulting FinFET device is an n-type FinFET, the source/drain structures can include silicon carbide (SiC), silicon phosphorous (SiP), phosphorous-doped silicon carbon (SiCP), or the like. When the resulting FinFET device is a p-type FinFET, the source/drain structures can include SiGe, and a p-type impurity such as boron or indium.

The source/drain structures 354-368 may be implanted with dopants, followed by an annealing process. The implanting process may include forming and patterning masks such as a photoresist to cover the regions of the FinFET device 300 that are to be protected from the implanting process. The source/drain structures 354-368 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain structures 354-368 of a P-type transistor. N-type impurities, such as phosphorous or arsenide, may be implanted in the source/drain structures 354-368 of an N-type transistor. In some embodiments, the source/drain structures 354-368 may be in situ doped during their growth.

Next, the ILD 363 is formed over the source/drain structures 354-368, with a contact etch stop layer (not shown) disposed therebetween. The contact etch stop layer can function as an etch stop layer in a subsequent etching process, and may include a suitable material such as silicon oxide, silicon nitride, silicon oxynitride, combinations thereof, or the like, and may be formed by a suitable formation method such as CVD, PVD, combinations thereof, or the like. The ILD 363 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

Figure 4A:
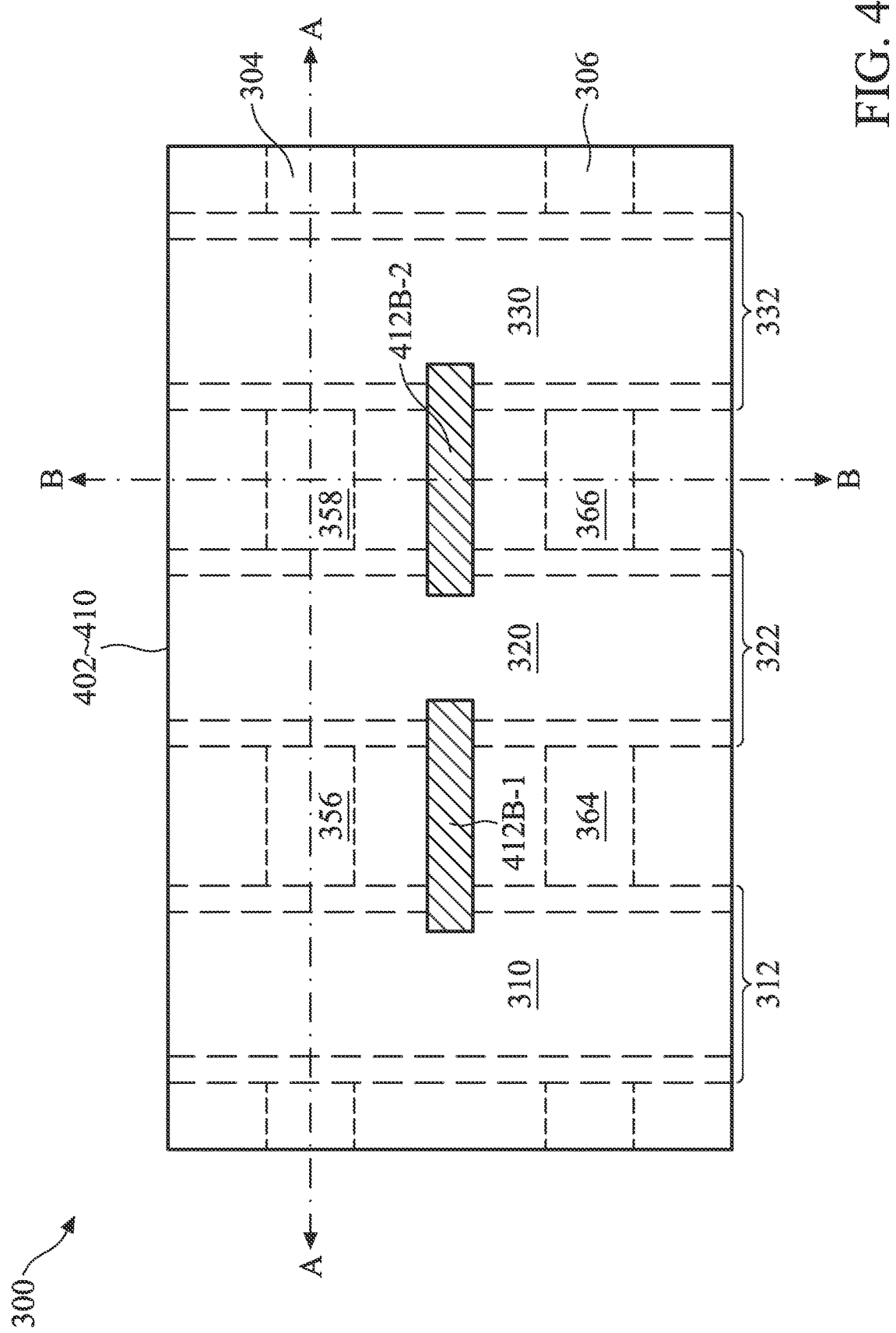
Figure 4B:
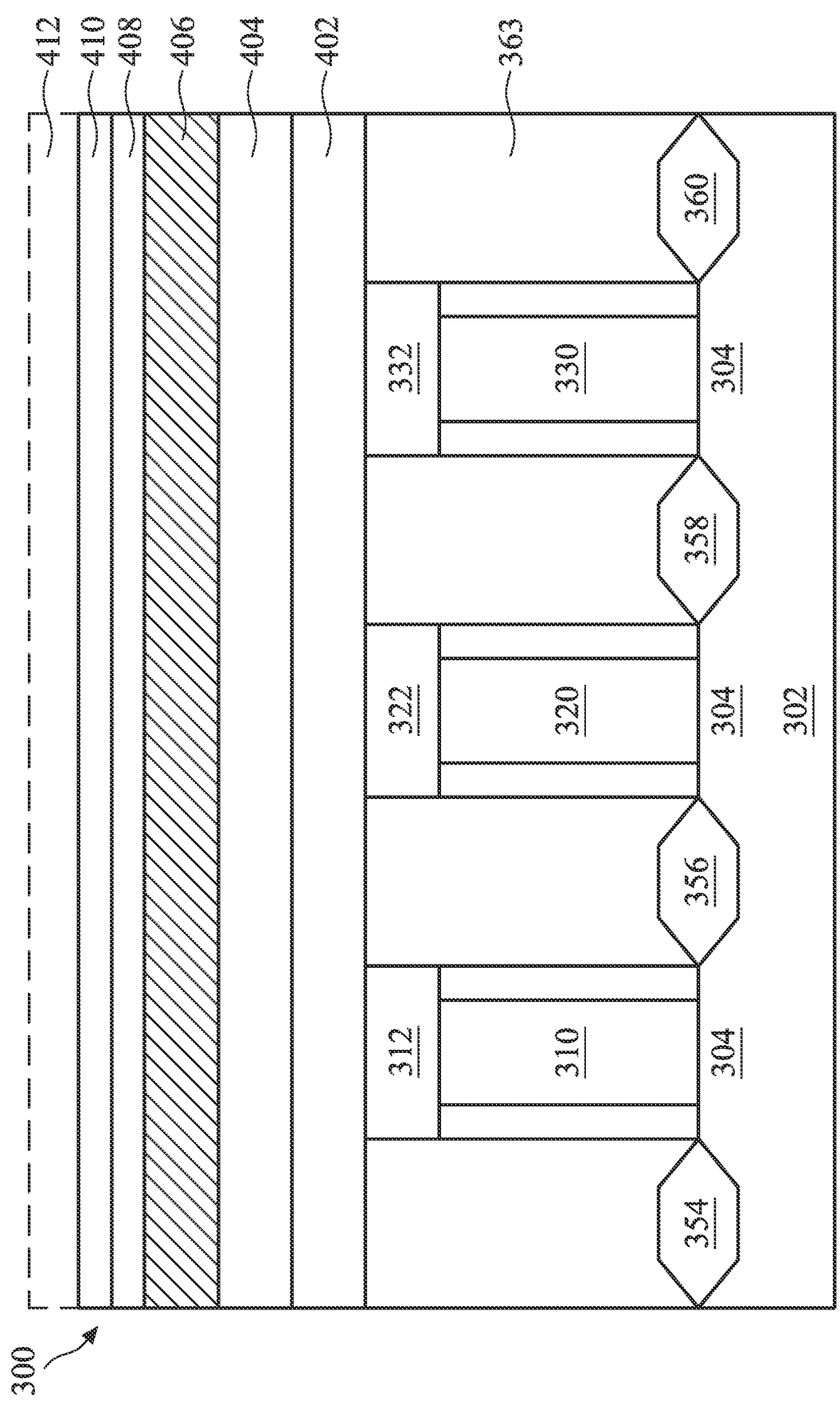
Figure 4C:
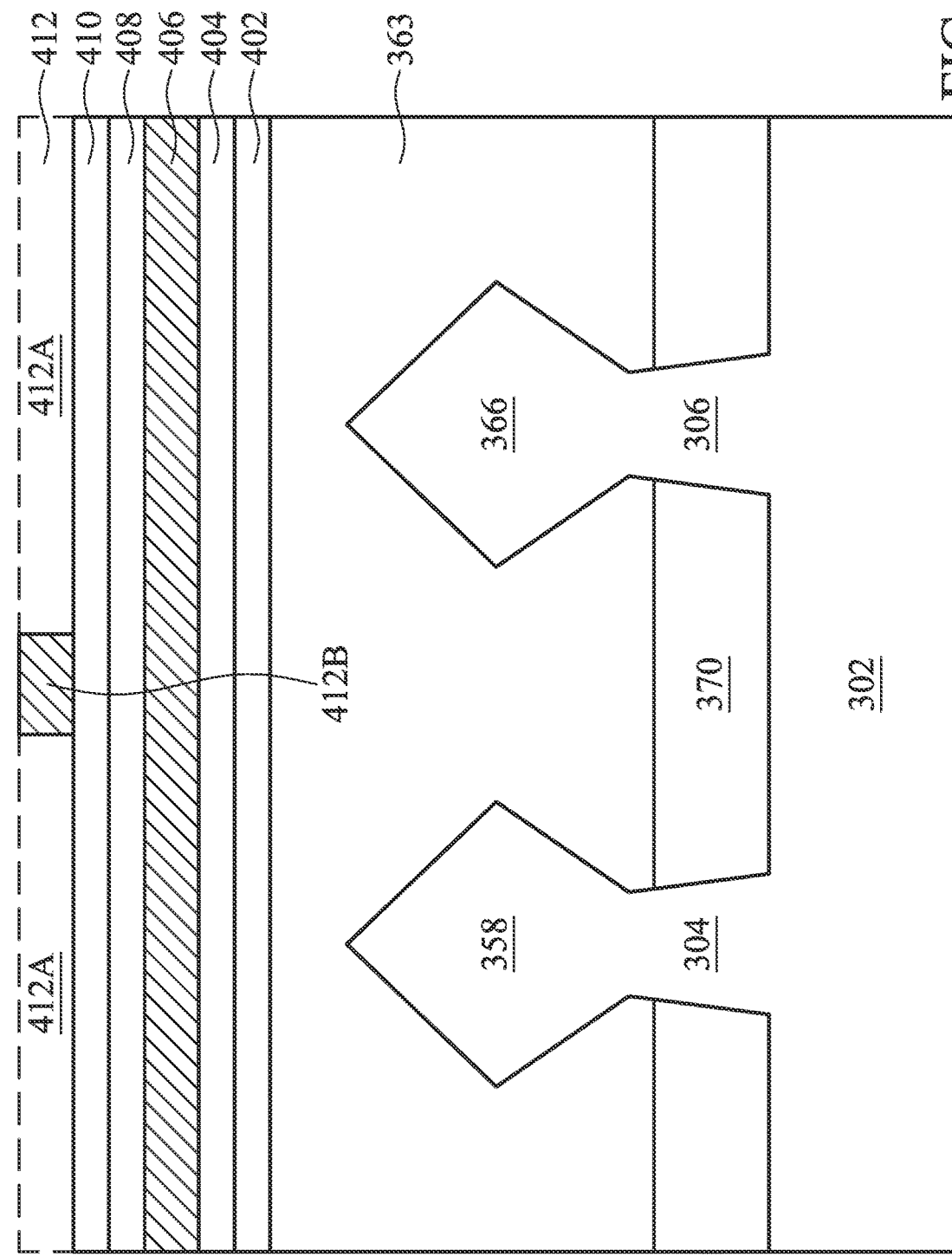

Corresponding to operation 204 of FIG. 2, FIG. 4A is a top view of the FinFET device 300 that includes a hard mask layer 402, a dielectric layer 404, a patternable layer 406, and one or more (first) imaging layers 408, 410, and 412 at one of the various stages of fabrication. FIGS. 4B and 4C illustrate corresponding cross-sectional view of FIG. 4A cut along cross-section A-A and cross-section B-B, respectively.

The hard mask layer 402 is formed over the ILD 363 and the active gate structures 310-330 (as shown in FIGS. 4B-C) by any suitable process (e.g., CVD, PECVD). The hard mask layer 402 may include tungsten carbide (WC). The hard mask layer 402 may include a nitrogen-containing material such as, for example, titanium nitride, tantalum nitride, other suitable nitrogen-containing materials, and/or combinations thereof. The hard mask layer 402 is formed to have any suitable thickness.

The dielectric layer 404 is formed by any suitable process (e.g., CVD, PECVD, or FCVD) between the hard mask layer 402 and the patternable layer 406. In some embodiments, the dielectric layer 404 is optional. The dielectric layer 404, sandwiched between the hard mask layer 402 and the patternable layer 406, can improve the difference of etching selectivities between the hard mask layer 402 and the patternable layer 406. The dielectric layer 404 can have the similar material as the ILD 363. For example, the dielectric layer 404 can include a material such as silicon oxide, silicon nitride, silicon oxynitride, combinations thereof, or the like.

The patternable layer 406, which may include silicon, is formed by any suitable process (e.g., CVD, PECVD) over the hard mask layer 402, or the dielectric layer 404 (if present). The patternable layer 406 can be patterned to form a patterned structure that is configured to define a spacing (of the ILD 363) between adjacent source/drain structures (e.g., 358 and 366). In accordance with various embodiments, such a patterned structure can be "trimmed" to have a narrower width (along the direction B-B) so as to further reduce the spacing, which can increase the critical dimension of interconnect structures connected to the source/drain structures. In turn, respective contact resistances of the interconnect structures can be advantageously reduced. Details of the patterned structure will be discussed in further detail below.

The one or more first imaging layers 408-412 can each be a photoresist layer (also referred to as a resist layer, photosensitive layer, patterning layer, light sensitive layer, etc.) that is responsive to an exposure process for creating patterns. The first imaging layers may be a positive-type or negative-type resist material and may form a multi-layer structure. One example resist material is a chemical amplifier (CA) resist. In the present example shown in FIGS. 4B-C, a tri-layer resist patterning scheme is utilized. Thus, three imaging layers are shown: the bottom (imaging) layer 408, the middle (imaging) layer 410, and the upper (imaging) layer 412. The bottom layer 408 is formed over the patternable layer 406, the middle layer 410 is formed over the bottom layer 408, and the upper layer 412 is formed over the middle layer 410. It is understood that other patterning layer schemes, such as a single imaging layer, may be used while remaining within the scope of the present disclosure.

The bottom, middle, and upper layers 408-412 can include any suitable material. For example, the imaging layers 408-412 may include various organic and/or inorganic materials. In one example, the bottom layer 408 may include an organic layer, the middle layer 410 may include an inorganic layer, and the upper layer 412 may include an organic layer. The bottom organic layer 408 may include a photoresist material, an anti-reflective coating (ARC) material, a polymer material, and/or other suitable materials. The middle inorganic layer 410 may include an oxide layer, such as a low temperature CVD oxide, an oxide derived from TEOS (tetraethylorthosilicate), silicon oxide, or silane oxide. Another example includes the middle layer 410 as a Si-containing anti-reflective coating (ARC) material, such as a 42% Si-containing ARC layer. The upper organic layer 412 may comprise an organic photoresist material. Further, the imaging layers 408-412 can each have any suitable thickness.

Utilizing the tri-layer patterning technique, the upper, photoresist layer 412 is first patterned by a photolithography process and/or processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography process can include exposing one or more portions of the upper layer 412 while protecting one or more other portions of the upper layer 412, for example in FIG. 4C, 412A being unexposed and 412B being exposed, or 412A being exposed and 412B being unexposed.

In an example where the upper layer 412 includes a negative resist material, the exposed portions (e.g., 412B) may become insoluble upon exposure, while the unexposed portions (e.g., 412A) remain soluble. In another example where the upper layer 412 includes a positive resist material, the exposed portions (e.g., 412A) may become soluble upon exposure, while the unexposed portions (e.g., 412B) remain insoluble. The patterning of the photoresist layer 412 can use one or more masks to form the one or more exposed and unexposed portions 412A-B. The photolithography exposing process may also be implemented or replaced by other proper methods such as maskless photolithography, electron-beam writing, ion-beam writing, and molecular imprint. Further, the photolithography patterning and exposing process may implement krypton fluoride (KrF) excimer lasers, argon fluoride (ArF) excimer lasers, immersion lithography, ultraviolet radiation, extreme ultraviolet (EUV) radiation, and/or combinations thereof.

Next, one or more portions of the upper layer 412 (e.g., 412A shown in FIG. 4C) are removed to form a pattern in the upper layer 412 (e.g., 412B shown in FIG. 4C). In the foregoing example where the upper layer 412 includes negative resist material, the unexposed portion 412A is removed by any suitable process. The resulting or patterned upper layer 412 (e.g., 412B) can in turn define a spacing (of the ILD 363) between adjacent ones of the source/drain structures 354-368. As a non-limiting example, the resulting upper layer 412B can include portions 412B-1 and 412B-2 (as shown in FIG. 4A) with their vertical projections disposed between the source/drain structures 356 and 364 and between the source/drain structures 358 and 366, respectively. Although the resulting upper layer 412 is shown as having two portions (e.g., 412B-1-2), it is understood that the resulting upper layer 412 can include any number of portions, each of which has a vertical projection disposed between two adjacent source/drain structures, while remaining within the scope of the present disclosure.

In various embodiments, each of the portions 412B-1-2 can extend in parallel with the lengthwise direction of the fins 304-306, with a certain length that allows (a vertical projection of) its ends to overlap adjacent active gate structures. For example, a vertical projection of the ends of the portion 412B-1 can overlap the active gate structures 310 and 320 (or overlap at least the respective gate spacers); and a vertical projection of the ends of the portion 412B-2 can overlap the active gate structures 320 and 330 (or overlap at least the respective gate spacers). Such an overlap can later be used to define the end portions of a patterned structure (e.g., of the patternable layer 406) that are clamped by at least one imaging layer, while being trimmed, which will be discussed in further detail below with respect to FIGS. 8A-C.

Figure 5A:
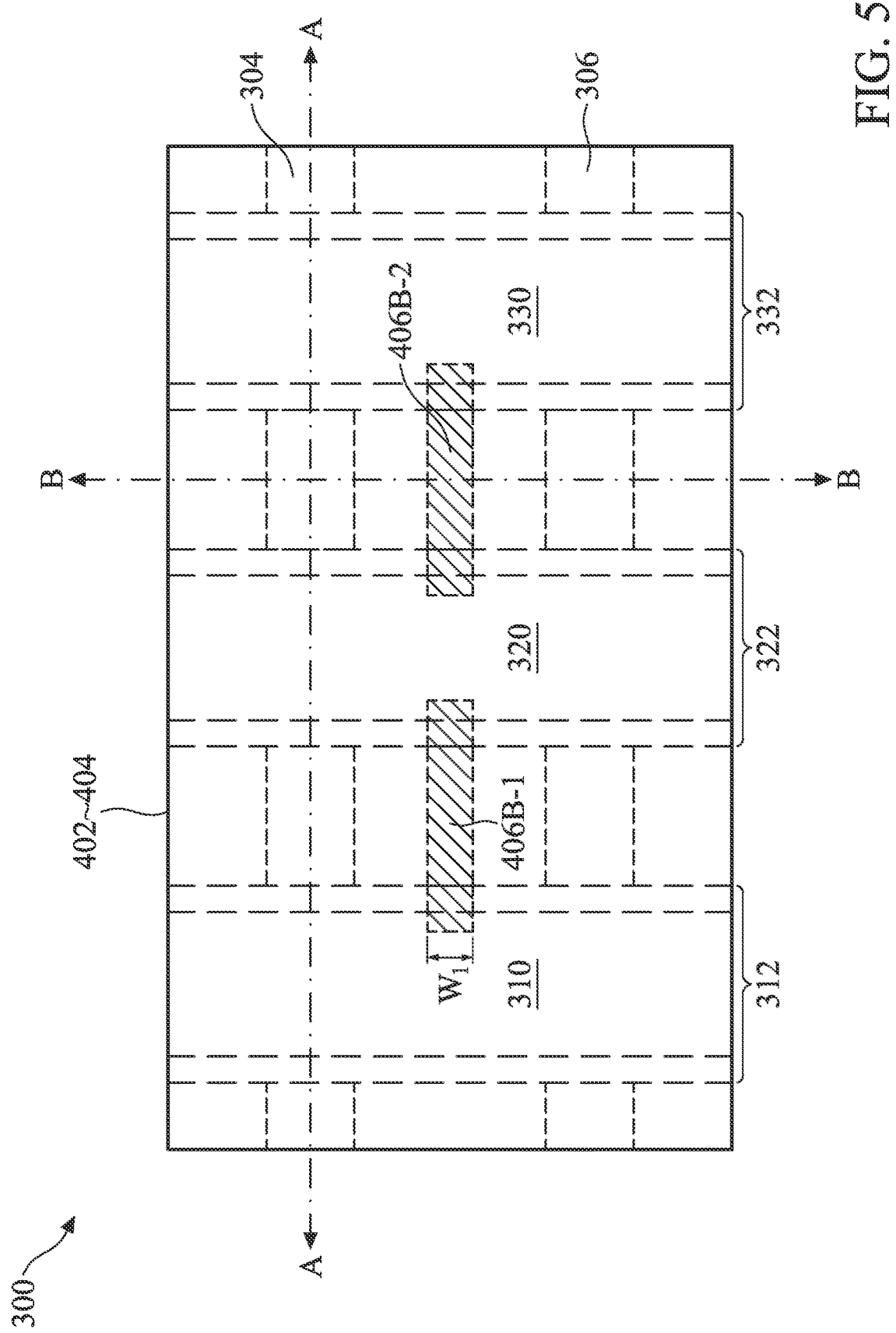
Figure 5B:
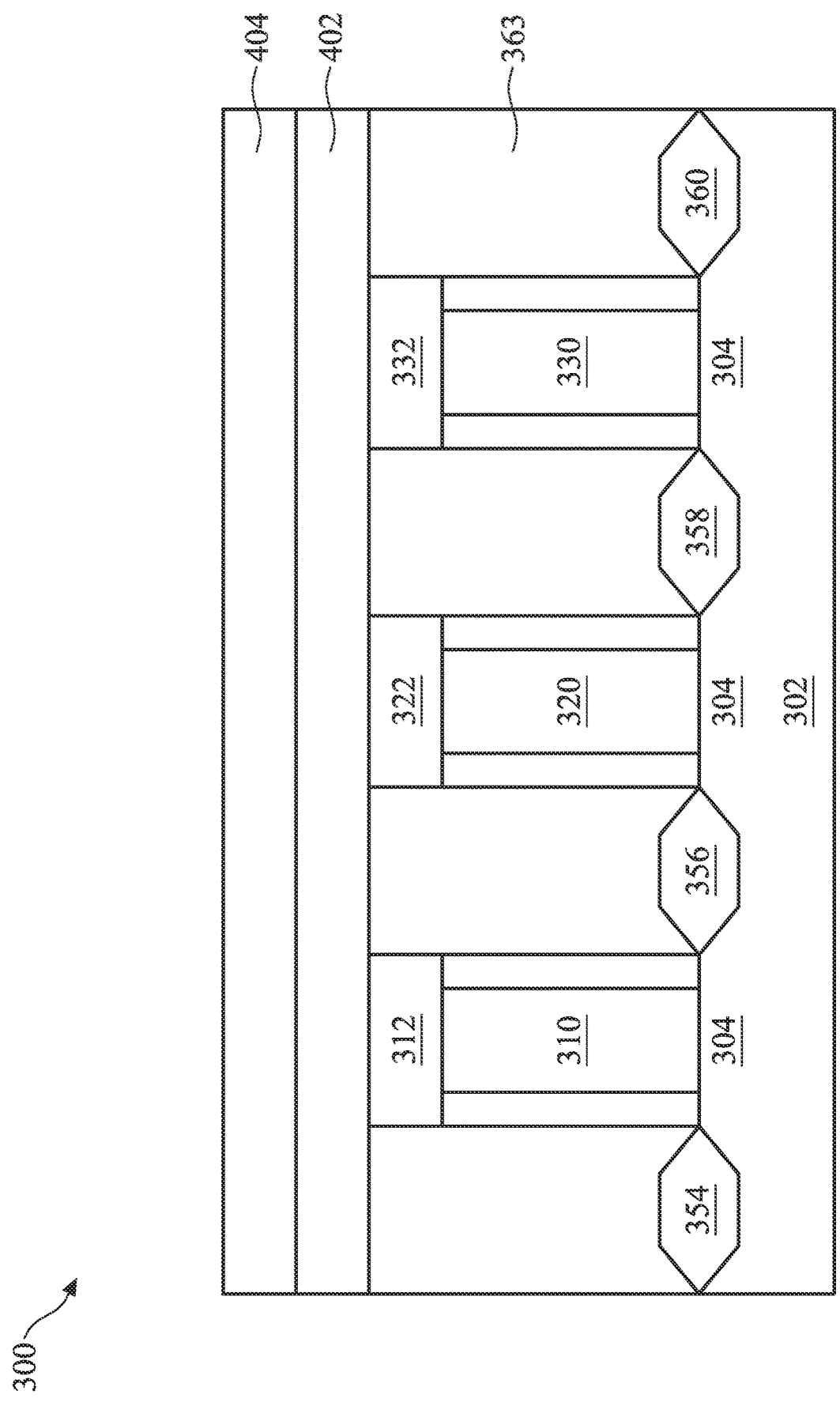

Corresponding to operation 206 of FIG. 2, FIG. 5A is a top view of the FinFET device 300 that includes patterned structures 406B-1 and 406B-2 (which are sometimes referred to as patterned structure 406B) at one of the various stages of fabrication. FIGS. 5B and 5C illustrate corresponding cross-sectional view of FIG. 5A cut along cross-section A-A and cross-section B-B, respectively.

Upon forming the resulting upper layer 412, a pattern of the upper layer 412 (e.g., portions 412B-1-2 shown in FIG. 4A) is then transferred to the underlying layers. For example, the portions 412B-1-2 are transferred to the middle layer 410, and to the bottom layer 408 via one or more etching process, including various dry etching, wet etching, and/or other etching methods (e.g., reactive ion etching). Subsequently, the remaining upper, middle, and bottom layers are removed by any suitable process, including a photoresist stripping process. It is understood that the upper layer, middle layer, and bottom layer may be simultaneously or independently removed. For example, while transferring the pattern from the upper layer 412 to the middle layer 410, the upper layer 412 may be simultaneously removed; and while transferring the pattern in the middle layer 410 to the bottom layer 408, the middle layer 410 may be simultaneously removed.

Using at least one of the remaining imaging layers 408-412, with the transferred pattern, as a protective mask, one or more portions of the patternable layer 406 (e.g., 406A shown in FIG. 5C) are removed via an etching process to form the patterned structures 406B-1 and 406B-2, as shown in FIG. 5A. The etching process can include a dry etching process that implements an oxygen-containing gas, fluorine-containing gas (e.g., $CF_4$, $NF_3$, $SF_6$, $CH_2F_2$, $CHF_3$, and/or $CH_3F$), chlorine-containing gas (e.g., $Cl_2$, and/or $BCl_3$), bromine-containing gas (e.g., HBr), other suitable gases and/or plasmas, or combinations thereof. After the etching process, the remaining imaging layer(s) are removed.

As shown in FIG. 5A, the patterned structure 406B can have a global width, $W_1$, along the lengthwise direction of the active gate structures 310-330. In other words, the patterned structure 406B may have only one width along such a direction, at this fabrication stage. As shown in FIG. 5C, the patterned structure 406B can have a vertical projection on the ILD 363, which may later be formed as a dielectric spacing between respective interconnect structures connected to the source/drain structures 358 and 366. As will be discussed below, the patterned structure 406B can later be trimmed to have multiple widths, e.g., a narrower width along its central (or non-clamped) portion while keeping its end portions having the width $W_1$, which can cause the dielectric spacing to accordingly become narrower.

Figure 6A:
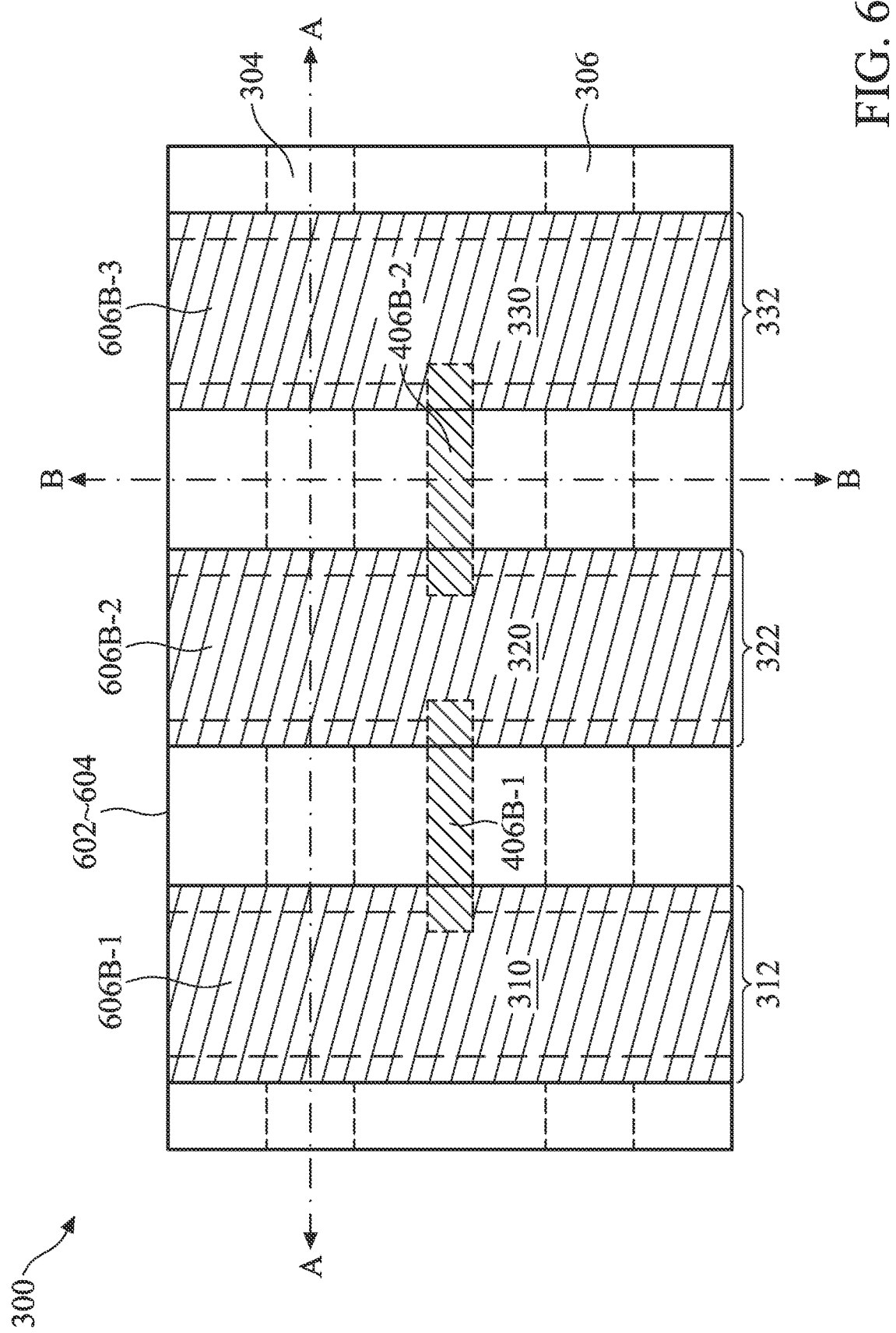
Figure 6B:
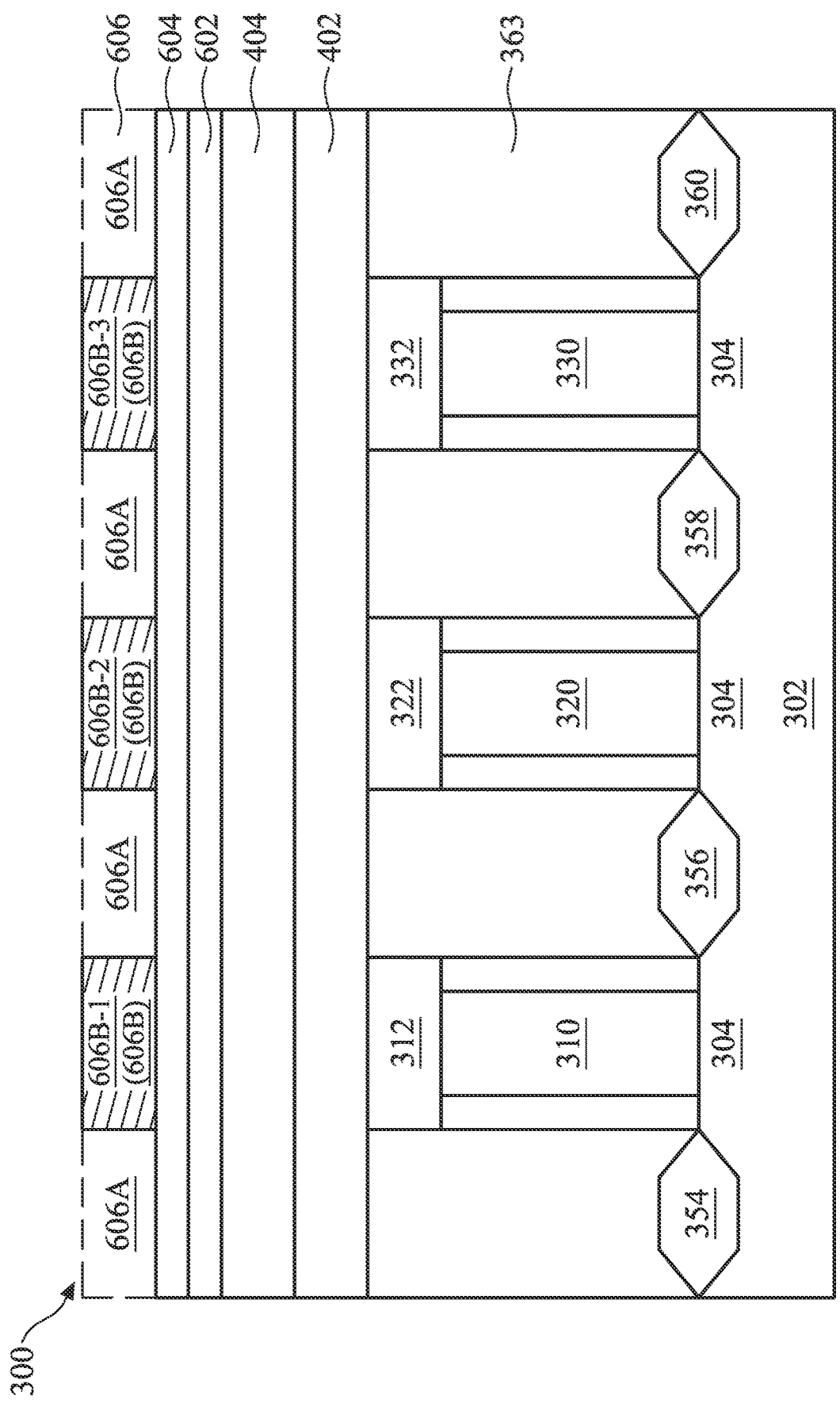
Figure 6C:
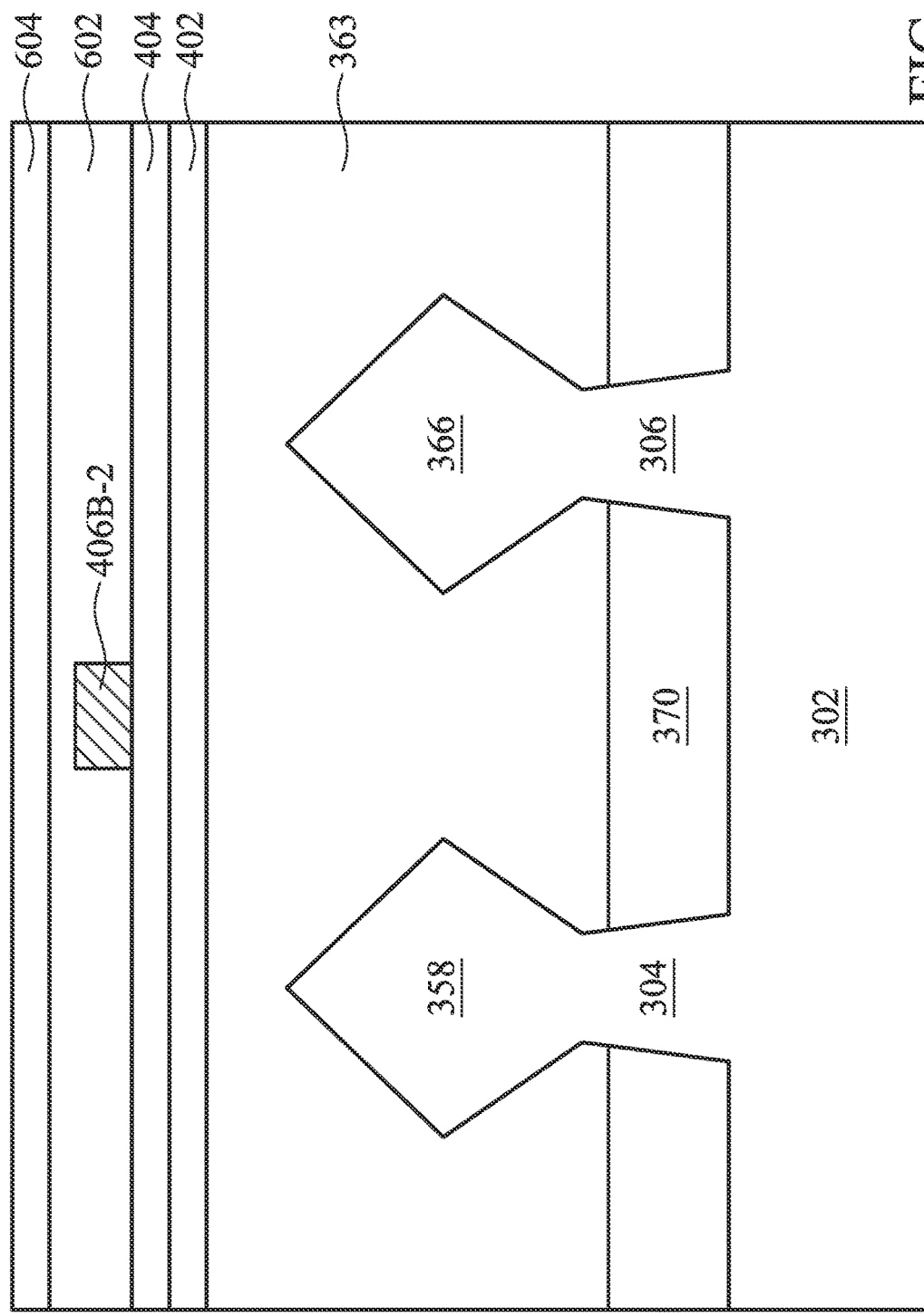

Corresponding to operation 208 of FIG. 2, FIG. 6A is a top view of the FinFET device 300 that includes one or more (second) imaging layers 602, 604, and 606 at one of the various stages of fabrication. FIGS. 6B and 6C illustrate corresponding cross-sectional view of FIG. 6A cut along cross-section A-A and cross-section B-B, respectively.

The one or more second imaging layers 602-606 can each be a photoresist layer (also referred to as a resist layer, photosensitive layer, patterning layer, light sensitive layer, etc.) that is responsive to an exposure process for creating patterns. The second imaging layers may be a positive-type or negative-type resist material and may form a multi-layer structure. One example resist material is a chemical amplifier (CA) resist. In the present example shown in FIGS. 6B-C, a tri-layer resist patterning scheme is utilized. Thus, three imaging layers are shown: the bottom (imaging) layer 602, the middle (imaging) layer 604, and the upper (imaging) layer 606. The bottom layer 602 is formed over the dielectric layer 404 (with the patterned structure 406B, if any, disposed therebetween), the middle layer 604 is formed over the bottom layer 602, and the upper layer 606 is formed over the middle layer 604. It is understood that other patterning layer schemes, such as a single imaging layer, may be used while remaining within the scope of the present disclosure.

The bottom, middle, and upper layers 602-606 can include any suitable material. For example, the imaging layers 602-606 may include various organic and/or inorganic materials. In one example, the bottom layer 602 may include an organic layer, the middle layer 604 may include an inorganic layer, and the upper layer 606 may include an organic layer. The bottom organic layer 602 may include a photoresist material, an anti-reflective coating (ARC) material, a polymer material, and/or other suitable materials. The middle inorganic layer 604 may include an oxide layer, such as a low temperature CVD oxide, an oxide derived from TEOS (tetraethylorthosilicate), silicon oxide, or silane oxide. Another example includes the middle layer 604 as a Si-containing anti-reflective coating (ARC) material, such as a 42% Si-containing ARC layer. The upper organic layer 606 may comprise an organic photoresist material. Further, the imaging layers 602-606 can each have any suitable thickness.

Utilizing the tri-layer patterning technique, the upper, photoresist layer 606 is first patterned by a photolithography process and/or processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography process can include exposing one or more portions of the upper layer 606 while protecting one or more other portions of the upper layer 606, for example in FIG. 6B, 606A being unexposed and 606B being exposed, or 606A being exposed and 606B being unexposed.

In an example where the upper layer 606 includes a negative resist material, the exposed portions (e.g., 606B) may become insoluble upon exposure, while the unexposed portions (e.g., 606A) remain soluble. In another example where the upper layer 606 includes a positive resist material, the exposed portions (e.g., 606A) may become soluble upon exposure, while the unexposed portions (e.g., 606B) remain insoluble. The patterning of the photoresist layer 606 can use one or more masks to form the one or more exposed and unexposed portions 606A-B. The photolithography exposing process may also be implemented or replaced by other proper methods such as maskless photolithography, electron-beam writing, ion-beam writing, and molecular imprint. Further, the photolithography patterning and exposing process may implement krypton fluoride (KrF) excimer lasers, argon fluoride (ArF) excimer lasers, immersion lithography, ultraviolet radiation, extreme ultraviolet (EUV) radiation, and/or combinations thereof.

Next, one or more portions of the upper layer 606 (e.g., 606A shown in FIG. 6B) are removed to form a pattern in the upper layer 606 (e.g., 606B shown in FIG. 6B). In the foregoing example where the upper layer 606 includes negative resist material, the unexposed portion 606A is removed by any suitable process. The resulting or patterned upper layer 606 (e.g., 606B) can define contact holes for the source/drain structures 354-368. As a non-limiting example, the resulting upper layer 606B can include portions 606B-1, 606B-2, and 606B-3 (as shown in FIGS. 6A-B) with their vertical projections approximately aligned with the sacrificial helmet structures 312, 322, and 332, respectively. Although the resulting upper layer 606 is shown as having three portions (e.g., 606B-1-3), it is understood that the resulting upper layer 606 can include any number of portions, each of which has a vertical projection approximately aligned with a respective sacrificial helmet structure, while remaining within the scope of the present disclosure.

In various embodiments, each of the portions 606B-1-3 can extend in parallel with the lengthwise direction of a spacing between adjacent active gate structures 310-330. Further, a vertical projection of each of the portions 606B-1-3 can overlap at least one end portion of the adjacent patterned structure 406B, in accordance with some embodiments. For example, a vertical projection of the portion 606B-1 can overlap a first end portion of the patterned structure 406B-1; a vertical projection of the portion 606B-2 can overlap a second end portion of the patterned structure 406B-1 and a first end portion of the patterned structure 406B-2; and a vertical projection of the portion 606B-3 can overlap a second end portion of the patterned structure 406B-2. Such an overlap can later be used to define at least one imaging layer (e.g., the bottom layer 602) that can clamp the end portions of the patterned structure 406B, when the patterned structure is trimmed, which will be discussed in further detail below with respect to FIGS. 8A-C.

Figure 7A:
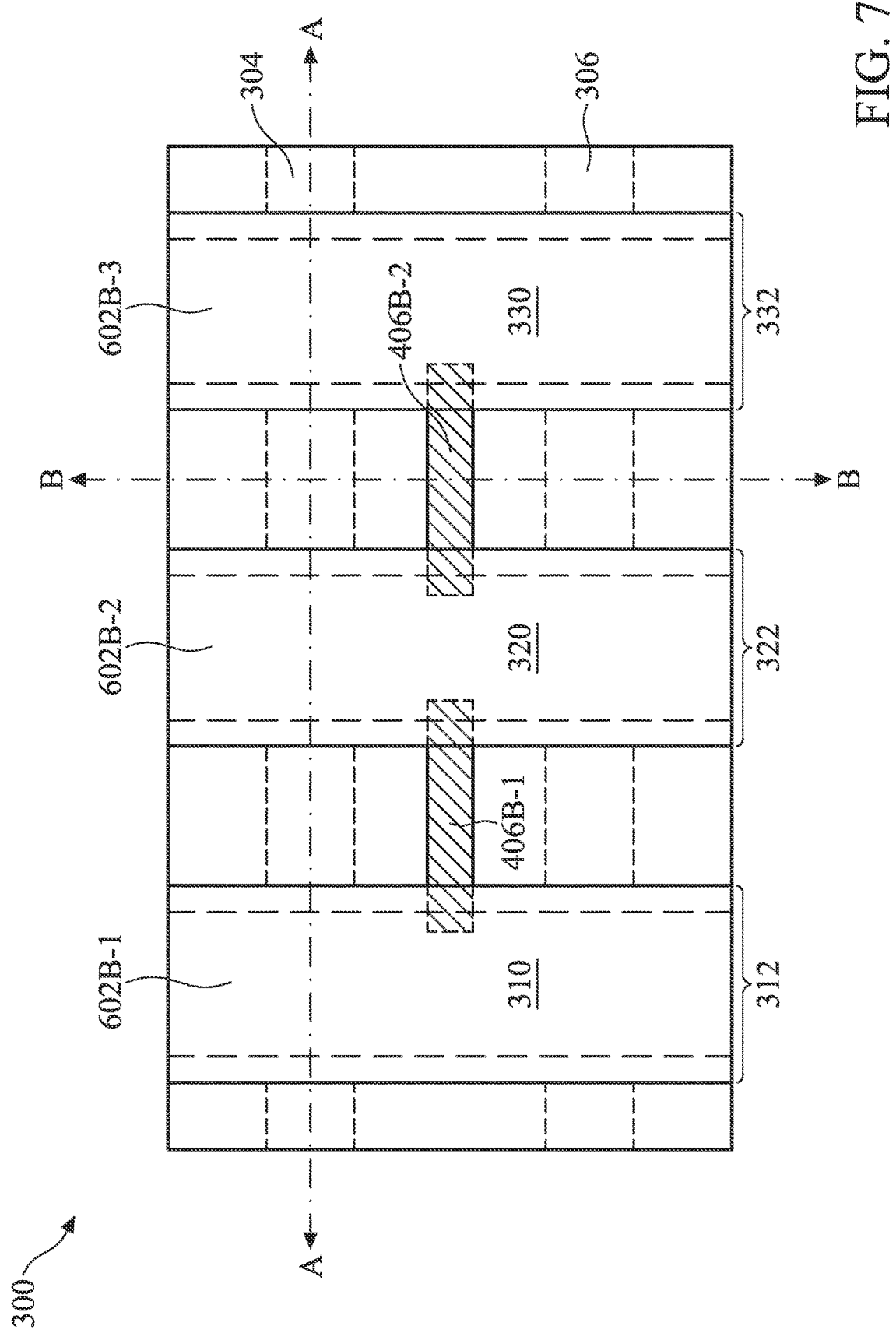
Figure 7B:
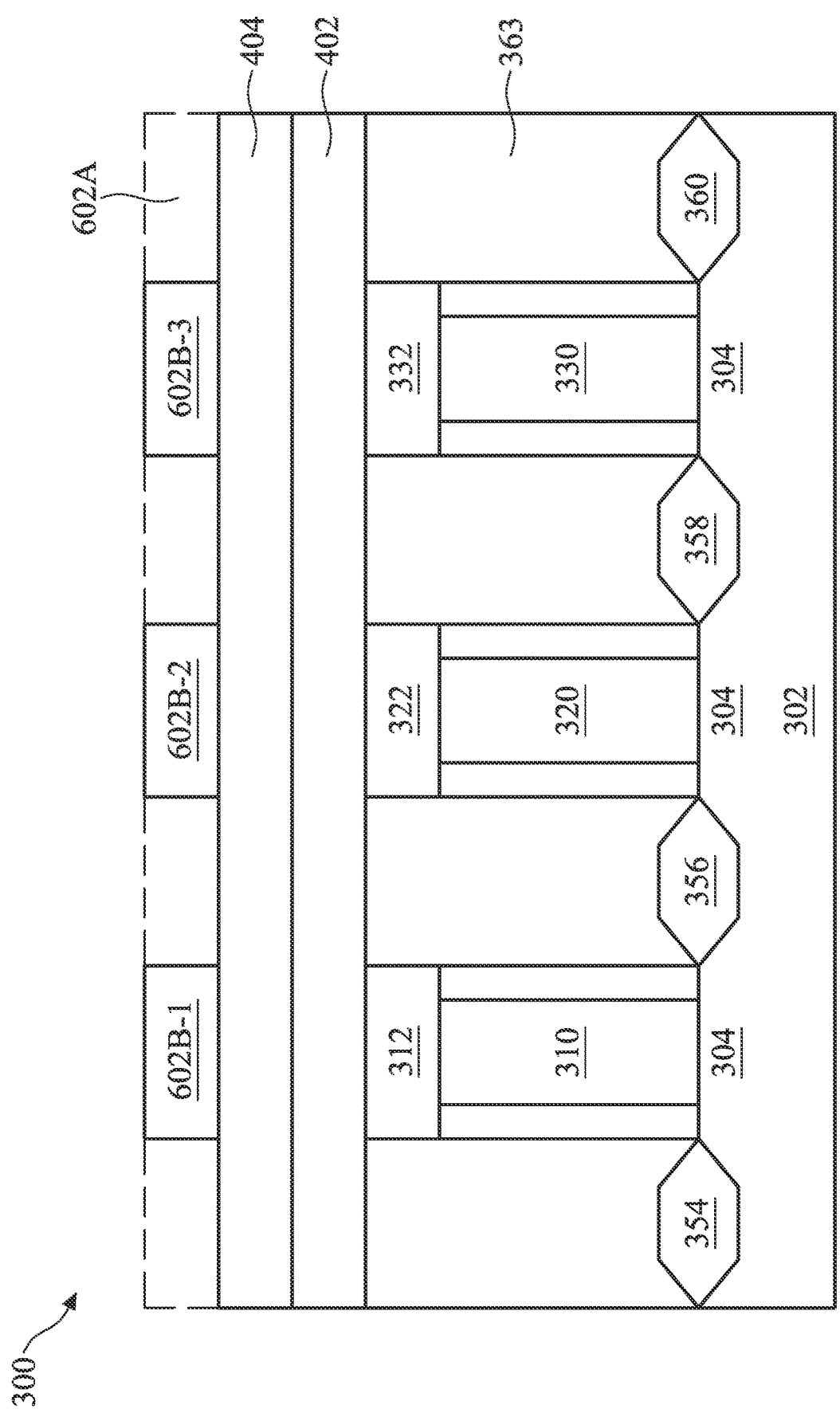

Corresponding to operation 210 of FIG. 2, FIG. 7A is a top view of the FinFET device 300 in which the one or more second imaging layers 602-606 are patterned at one of the various stages of fabrication. FIGS. 7B and 7C illustrate corresponding cross-sectional view of FIG. 7A cut along cross-section A-A and cross-section B-B, respectively.

Upon forming the resulting upper layer 606, a pattern of the upper layer 606 (e.g., portions 606B-1-3 shown in FIGS. 6A-B) is then transferred to the underlying layers. For example, the portions 606B-1-3 are transferred to the middle layer 604, and to the bottom layer 602 via one or more etching process, including various dry etching, wet etching, and/or other etching methods (e.g., reactive ion etching). Subsequently, the remaining upper, middle, and bottom layers are removed by any suitable process, including a photoresist stripping process. It is understood that the upper layer, middle layer, and bottom layer may be simultaneously or independently removed. For example, while transferring the pattern from the upper layer 606 to the middle layer 604, the upper layer 606 may be simultaneously removed; and while transferring the pattern in the middle layer 604 to the bottom layer 602, the middle layer 604 may be simultaneously removed.

Using at least one of the remaining imaging layers 602-606, with the transferred pattern, as a protective mask, one or more portions of the bottom layer 602 (e.g., 602A shown in FIG. 7B) are removed via an etching process to form a resulting or patterned bottom layer 602 (e.g., 602B), which includes three portions 602B-1, 602B-2, and 602B-3, as shown in FIGS. 7A-B. In various embodiments, the portions 602B-1, 602B-2, and 602B-3 of the resulting bottom layer 602B can be vertically aligned with the portions 606B-1, 606B-2, and 606B-3 of the resulting upper layer 606B, respectively. As such, each of the patterned structures 406B can be clamped or otherwise fixed at its respective end portions by at least two of the portions of the bottom layer 602B-1-3. For example in FIG. 7A, the end portions of the patterned structure 406B-1 are clamped by the portions 602B-1 and 602B-2, respectively; and the end portions of the patterned structure 406B-2 are clamped by the portions 602B-2 and 602B-3, respectively. The etching process can include a dry etching process that implements an oxygen-containing gas, fluorine-containing gas (e.g., $CF_4$, $NF_3$, $SF_6$, $CH_2F_2$, $CHF_3$), chlorine-containing gas (e.g., $Cl_2$, and/or $BCl_3$), bromine-containing gas (e.g., HBr), sulfide-containing gas, other suitable gases and/or plasmas, or combinations thereof. After the etching process of this fabrication stage, at least the remaining bottom layer 602 may remain, which can clamp the patterned structures 406B-1-2, while being trimmed.

Figure 8A:
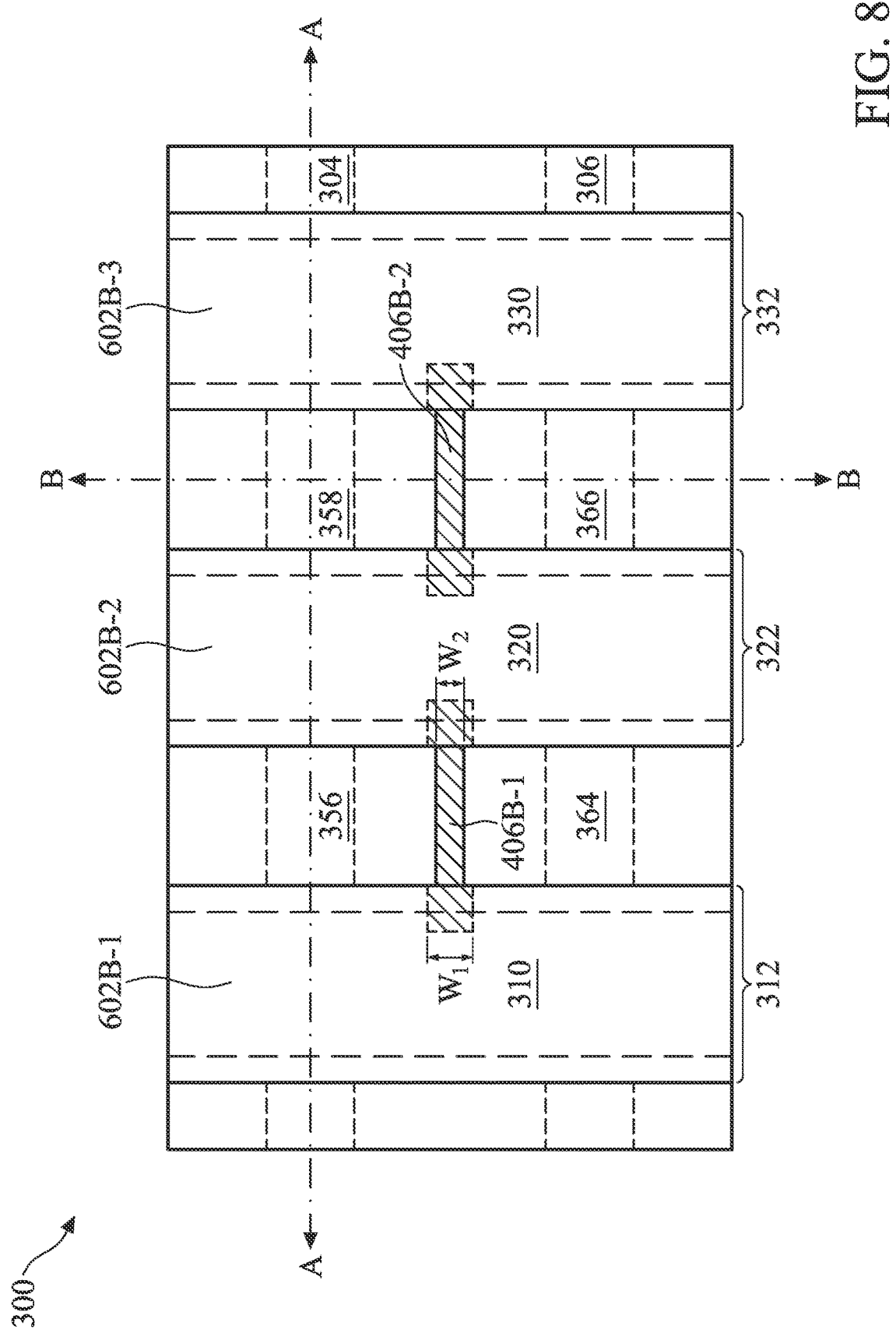

Corresponding to operation 212 of FIG. 2, FIG. 8A is a top view of the FinFET device 300 in which the pattered structure 406B is trimmed at one of the various stages of fabrication. FIGS. 8B and 8C illustrate corresponding cross-sectional view of FIG. 8A cut along cross-section A-A and cross-section B-B, respectively.

As shown in FIG. 8A, the patterned structure 406B is trimmed, along the lengthwise direction of the active gate structures 310-330 (e.g., along the cross-section B-B), to have multiple widths. Specifically, since the end portions of the patterned structure 406B are clamped, overlaid, or otherwise fixed by the respective portions of the resulting bottom layer 602B, a portion of the patterned structure 406B that is not overlaid by the resulting bottom layer 602B (e.g., the central portion) can be trimmed to have a narrower width, $W_2$, while the end portions can still have the original width, $W_1$. As such, the patterned structure 406B can have a bone-shaped profile, when viewed from the top at this fabrication stage. In some embodiments, the pre-trimmed width $W_1$ and the post-trimmed width $W_2$ may have a difference of at least 1 nanometer (nm). In some embodiments, the difference may be subjected to the pre-trimmed width $W_1$, which can be at least a fraction of $W_1$, for example, from about 10% to about 60%.

In accordance with various embodiments, the patterned structure 406B have such a trimmed width vertically projected on a portion of the ILD 363 between adjacent source/drain structures (e.g., between source/drain structures 356 and 364, between source/drain structures 358 and 366), which is also shown in FIG. 8C. A dielectric spacing between the adjacent source/drain structures (formed based on this portion of the ILD 363) can thus be defined to have a narrower width. With the dielectric spacing having a narrower width between the adjacent source/drain structures, respective interconnect structures connected to the source/drain structures can in turn extend further along the lengthwise direction of the active gate structures 310-330 (e.g., along the cross-section B-B), which can advantageously reduce their contact resistances.

In accordance with various embodiments, the patterned structure 406B may be trimmed by an etching process 801, as illustrated in FIG. 8C. By using the etching process 801, the patterned structure 406B can be trimmed to shrink its critical dimension (e.g., $W_2$), which may be beyond the limit of a lithography process. The etching process 801 can include a dry etching process and/or a wet etching process. The wet etching process can use an acid-based etchant such as, for example, sulfuric acid ($H_2SO_4$), perchloric acid ($HClO_4$), hydroiodic acid (HI), hydrobromic acid (HBr), nitric acide ($HNO_3$), hydrochloric acid (HCl), acetic acid ($CH_3COOH$), citric acid ($C_6H_8O_7$), potassium periodate ($KIO_4$), tartaric acid ($C_4H_6O_6$), benzoic acid ($C_6H_5COOH$), tetrafluoroboric acid ($HBF_4$), carbonic acid ($H_2CO_3$), hydrogen cyanide (HCN), nitrous acid ($HNO_2$), hydrofluoric acid (HF), phosphoric acid ($H_3PO_4$), or combinations thereof. In some examples, an alkaline-based etchant may be used. Such etchants may include but are not limited to ammonium hydroxide ($NH_4OH$) and potassium hydroxide (KOH). The dry etching process can implement an oxygen-containing gas, fluorine-containing gas (e.g., $CF_4$, $NF_3$, $SF_6$, $CH_2F_2$, $CHF_3$, and/or $CH_3F$), chlorine-containing gas (e.g., $Cl_2$, and/or $BCl_3$), bromine-containing gas (e.g., HBr), other suitable gases and/or plasmas, or combinations thereof.

Although in the illustrated example of FIGS. 8A and C, (the vertical projection of) the patterned structures 406B is located at a center of two adjacent source/drain structures, it should be understood that in some cases, the patterned structure 406B may be laterally shifted from such a center (e.g., due to misalignment in the patterning process). When this occurs, the patterned structure 406B may be trimmed asymmetrically along the lengthwise direction of the active gate structures 310-330. For example in FIG. 8C, when the patterned structure 406B-2 is shifted toward source/drain structure 358 (from a center of the source/drain structures 358 and 366), a left-hand side portion of the patterned structure 406B-2 may be trimmed more than a right-hand side portion of the patterned structure 406B-2. This can be achieved by adjusting a tilted angle of the etching process 801. For example, the left-hand side portion of the patterned structure 406B-2 may be exposed to more etchants of the etching process 801 than the right-hand side portion by adjusting etch directionality of the etching process 801. In another example, the left-hand side portion of the patterned structure 406B-2 may be etched at a higher etching rate than the right-hand side portion.

Figure 9A:
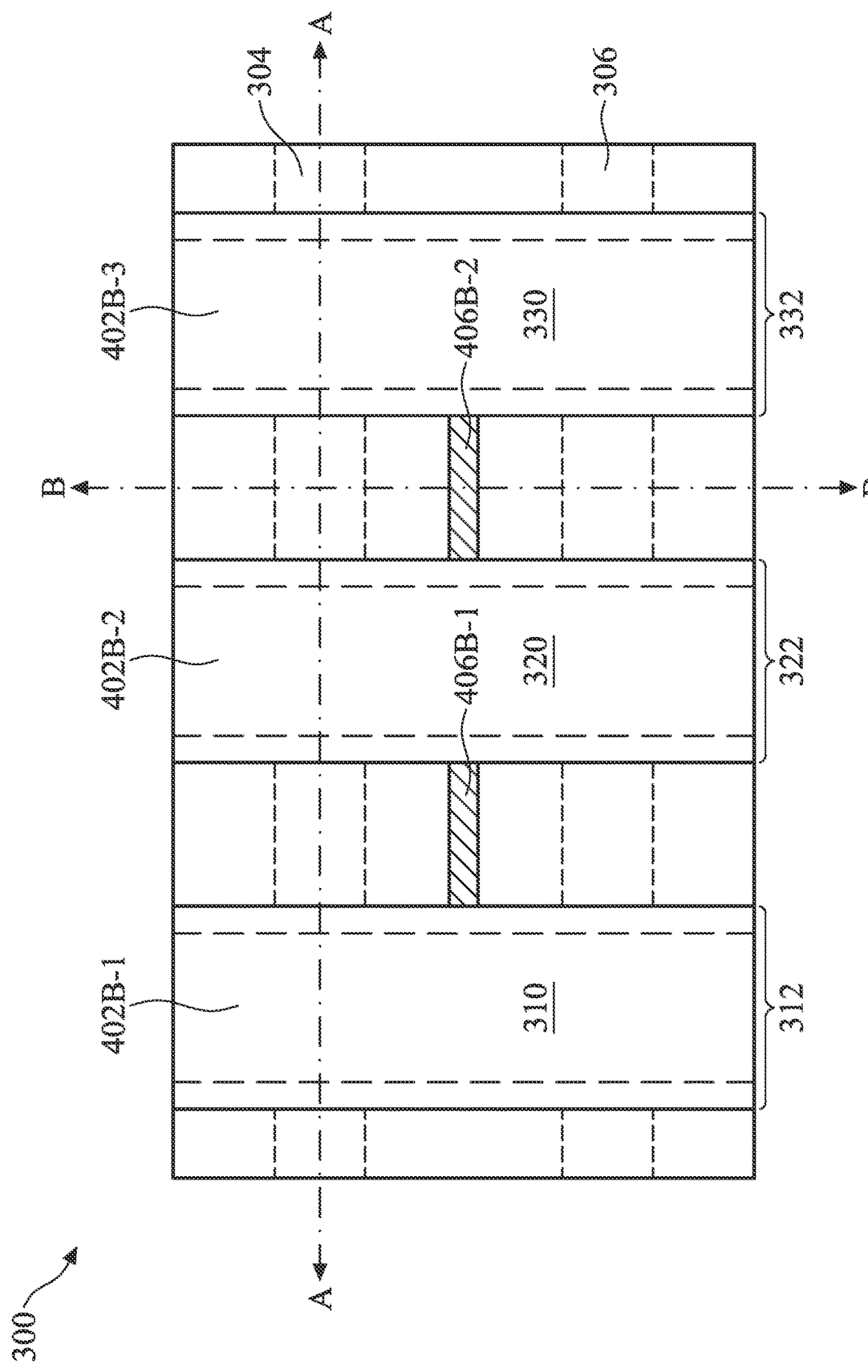
Figure 9B:
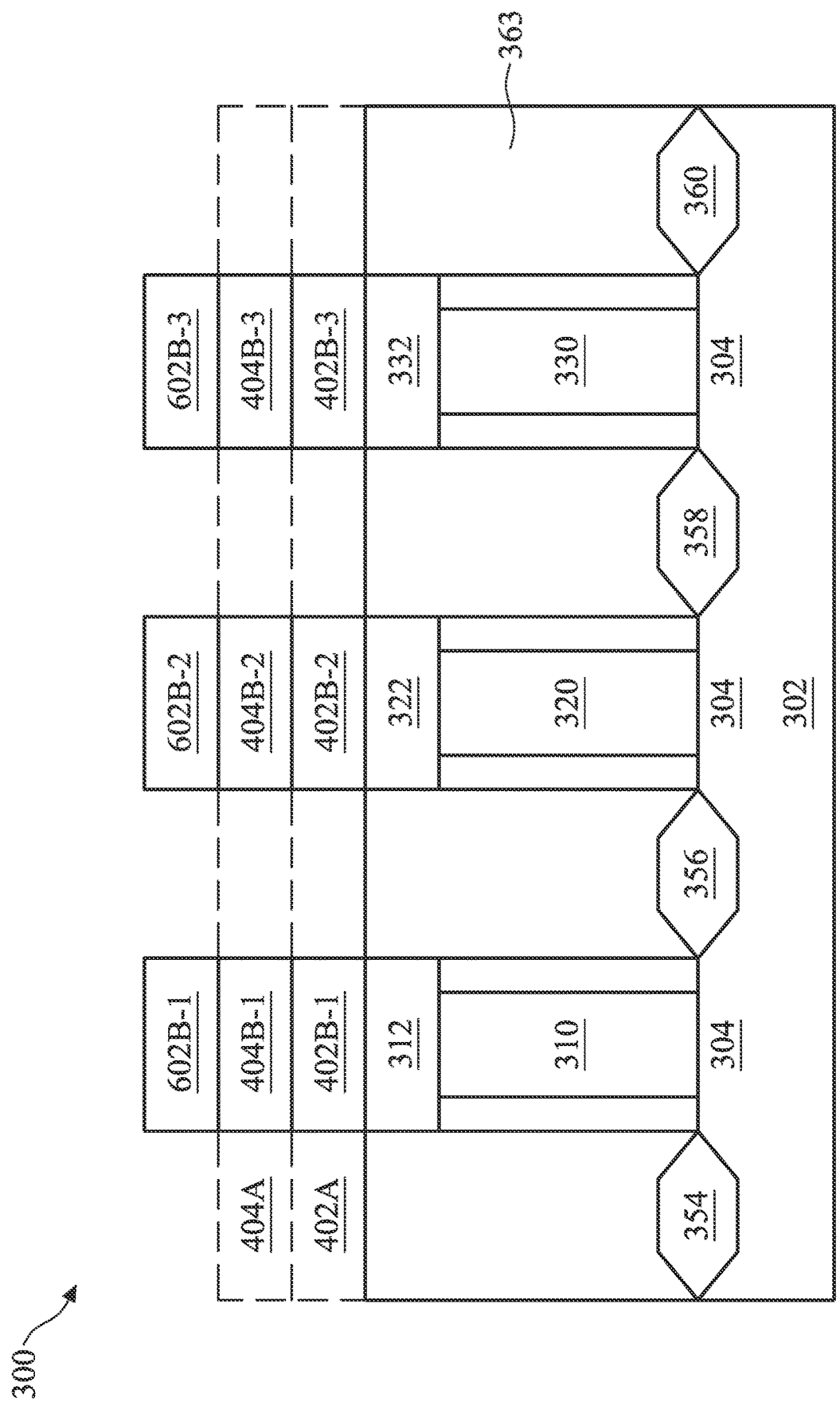

Corresponding to operation 214 of FIG. 2, FIG. 9A is a top view of the FinFET device 300 in which the dielectric layer 404 and the hard mask layer 402 are patterned at one of the various stages of fabrication. FIGS. 9B and 9C illustrate corresponding cross-sectional view of FIG. 9A cut along cross-section A-A and cross-section B-B, respectively.

Upon forming the resulting bottom layer 602B and trimming the patterned structure 406B, a pattern of the resulting bottom layer 602B (indicated as dotted lines in FIG. 9B) is then transferred to the underlying layers. As shown, the portions 602B-1-3 are transferred to the dielectric layer 404, and to the hard mask layer 402 via one or more etching process, including various dry etching, wet etching, and/or other etching methods (e.g., reactive ion etching). Subsequently, the resulting bottom layer 602B is removed by any suitable process, including a photoresist stripping process.

As shown in FIG. 9B along the lengthwise direction of the fins 304-306 (e.g., cross-section A-A), using the resulting bottom layer 602B as a protective mask, one or more portions of the dielectric layer 404 (e.g., 404A) and one or more portions of the hard mask later 402 (e.g., 402A) are removed via one or more etching processes to form a resulting or patterned dielectric layer 404 (e.g., 404B) and a resulting or patterned hard mask layer 402 (e.g., 402B), respectively. The resulting dielectric layer 404B may include three portions 404B-1, 404B-2, and 404B-3, and the resulting hard mask layer 402B may include three portions 402B-1, 402B-2, and 402B-3.

As shown in FIG. 9C along the lengthwise direction of the active gate structures 310-330 (e.g., cross-section B-B), the resulting dielectric layer 404B and the resulting hard mask layer 402 may inherit the trimmed profile of the patterned structure 406B. In some embodiment, each of the resulting dielectric layer 404B and resulting hard mask layer 402B has a width about almost equal to $W_2$.

The etching process can include a dry etching process that implements an oxygen-containing gas, fluorine-containing gas (e.g., $CF_4$, $NF_3$, $SF_6$, $CH_2F_2$, $CHF_3$, $C_4F_6$, and/or C4F8), chlorine-containing gas (e.g., $Cl_2$, and/or $BCl_3$), bromine-containing gas (e.g., HBr), other suitable gases and/or plasmas, or combinations thereof.

Figure 10A:
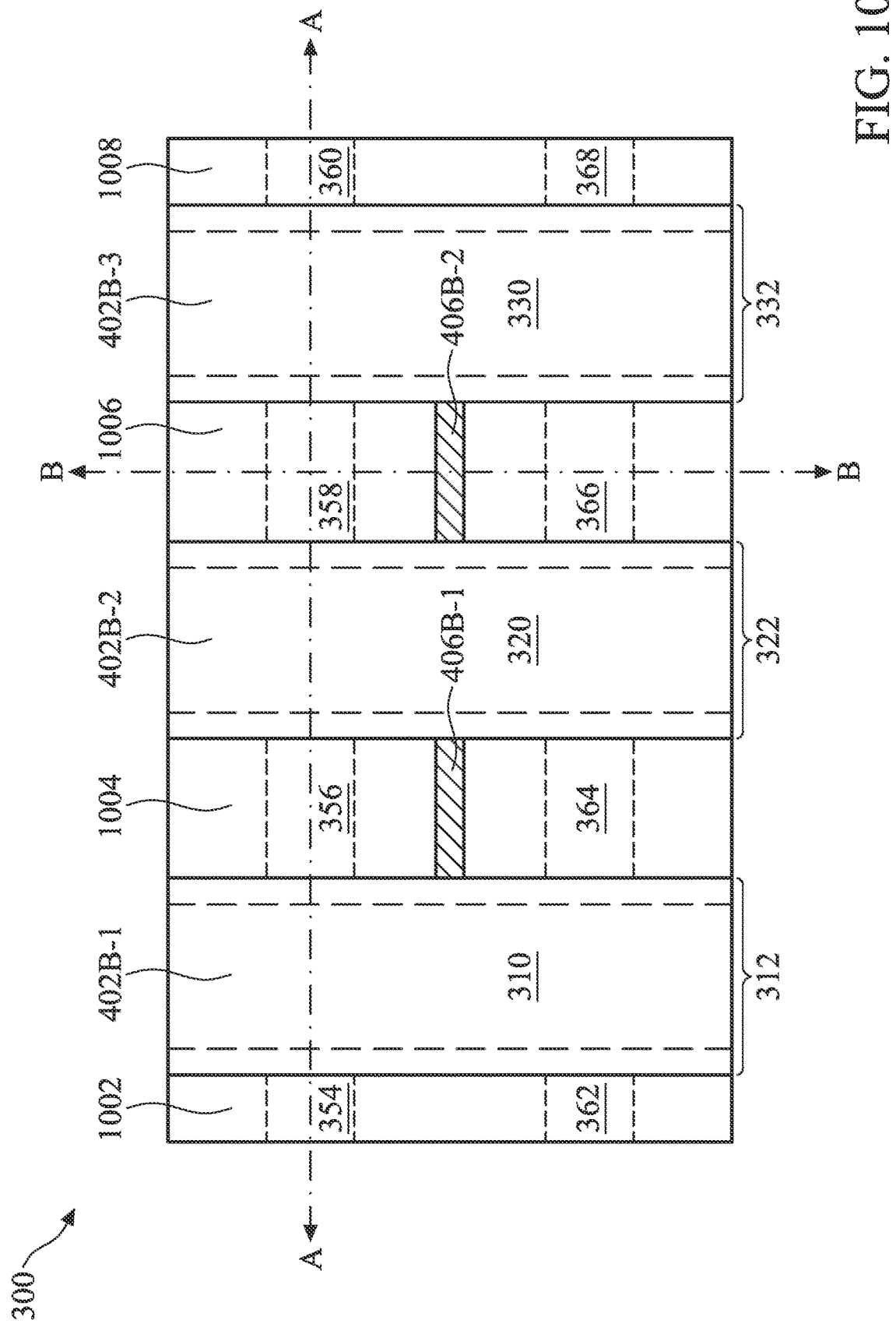
Figure 10B:
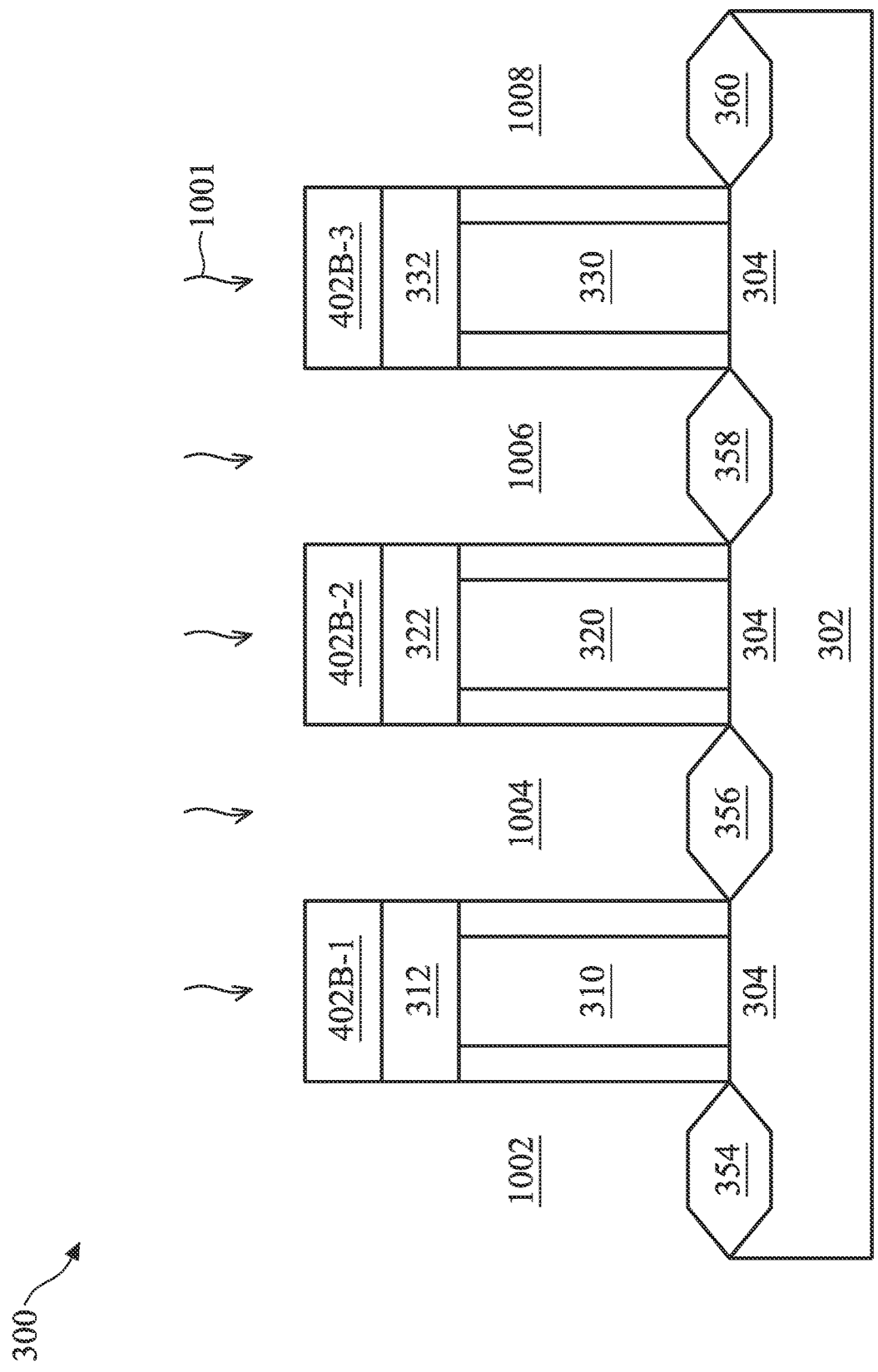
Figure 10C:
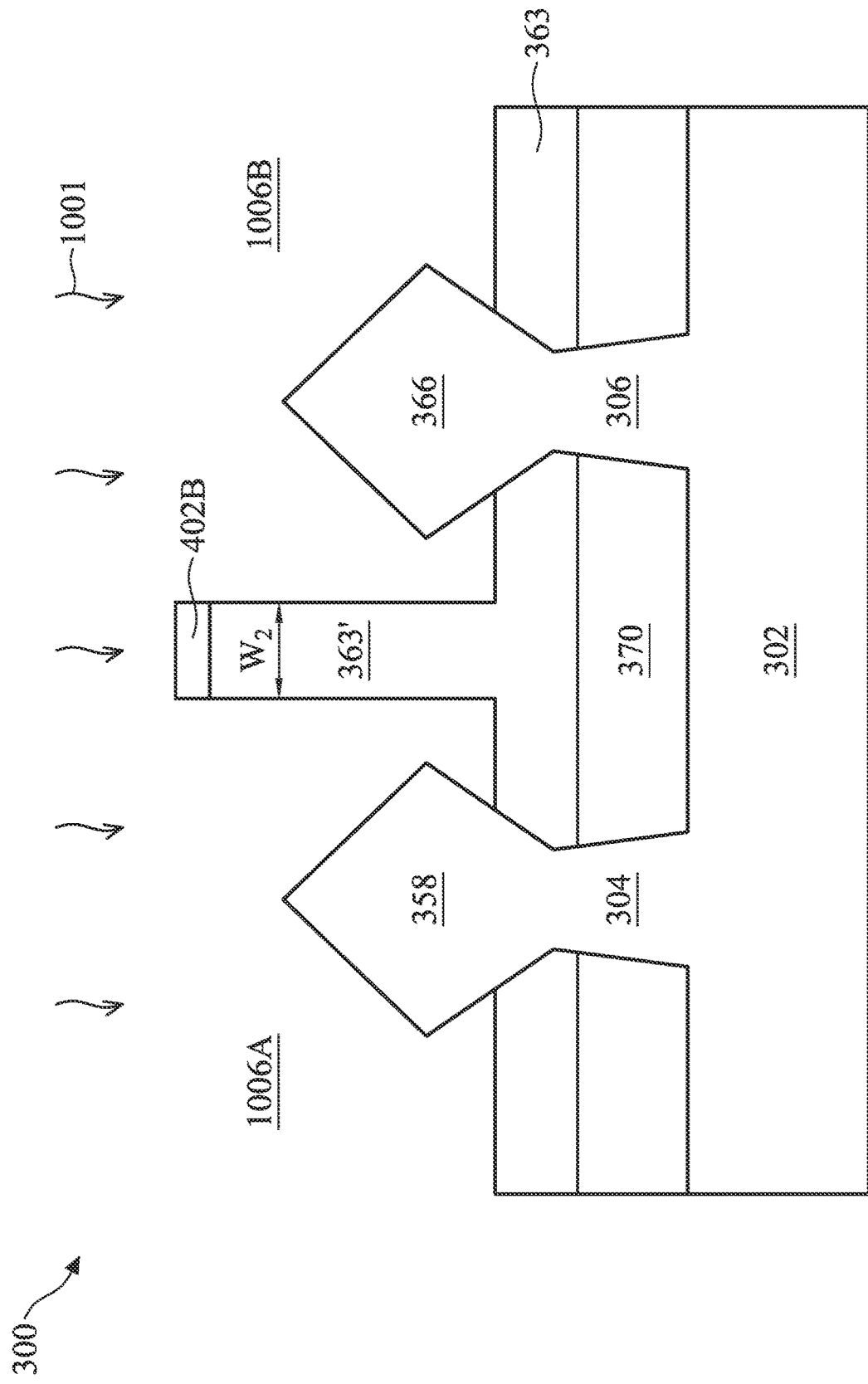

Corresponding to operation 216 of FIG. 2, FIG. 10A is a top view of the FinFET device 300 that includes contact holes 1002, 1004, 1006, and 1008 at one of the various stages of fabrication. FIGS. 10B and 10C illustrate corresponding cross-sectional view of FIG. 10A cut along cross-section A-A and cross-section B-B, respectively.

Using the remaining hard mask layer 402B as a protective mask, respective portions of the ILD 363 are removed via an etching process 1001 so as to form the contact holes 1002-1008. As shown in FIG. 9B along the lengthwise direction of the fins 304-306 (e.g., cross-section A-A), the remaining hard mask layer 402B (402B-1-3) exposes the portions of the ILD 363 that are vertically aligned with the source/drain structures 354-360, respectively. Thus, the portions of the ILD 363 are removed to form the contact holes 1002-1008, in which the contact holes 1002-1004 are on opposite sides of the active gate structure 310, the contact holes 1004-1006 are on opposite sides of the active gate structure 320, and the contact holes 1006-1008 are on opposite sides of the active gate structure 330.

As shown in FIG. 10C along the lengthwise direction of the active gate structures 310-330 (e.g., cross-section B-B), a portion of the ILD 363 masked or otherwise overlaid by the resulting hard mask layer 402B, 363', may remain after the etching process 1001. Such a remaining portion 363' may function as a dielectric spacing (hereinafter dielectric spacing 363') between two portions of the contact hole 1006, 1006A and 1006B, that expose source/drain structures 358 and 366, respectively. The dielectric spacing 363' may inherit the trimmed profile of the resulting hard mask layer 402B, with a width about equal to $W_2$. Due to the "trimmed" width of the dielectric spacing 363', respective widths of the contact holes 1006A and 1006B (along the cross-section B-B) can be enlarged. In other words, a distance between respective inner sidewalls of the adjacent contact holes (e.g., 1006A and 1006B) is shrunk.

The etching process can include a dry etching process that implements an oxygen-containing gas (e.g., $O_2$, CO, $CO_2$), fluorine-containing gas (e.g., $CF_4$, $NF_3$, $SF_6$, $CH_2F_2$, $CHF_3$, and/or $C_4F_6$, $C_4F_8$), other suitable gases and/or plasmas, or combinations thereof.

Although in the illustrated example of FIG. 10C, the dielectric spacing 363' has a global width (e.g., a pillar-shaped having a single width), it should be understood that the dielectric spacing 363' can present a tapered profile while remaining within the scope of the present disclosure. For example, the dielectric spacing 363' may include a lower portion having a first width and an upper portion having a second width, where the first width gradually decreases or increases to the second width. When the dielectric spacing 363' has a tapered profile, the second width may be closer to the width $W_2$ than the first width, in some embodiments.

Figure 11A:
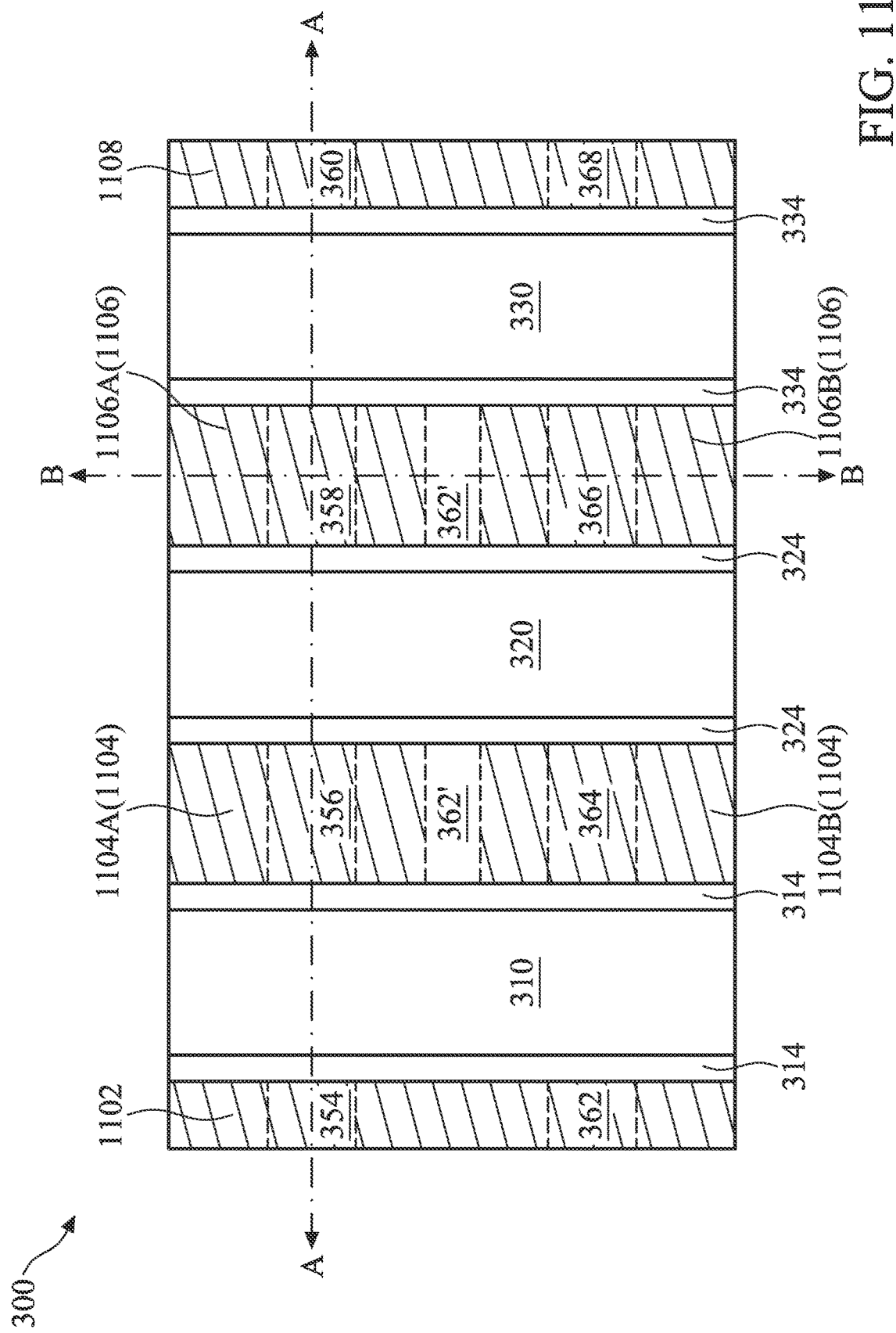
Figure 11B:
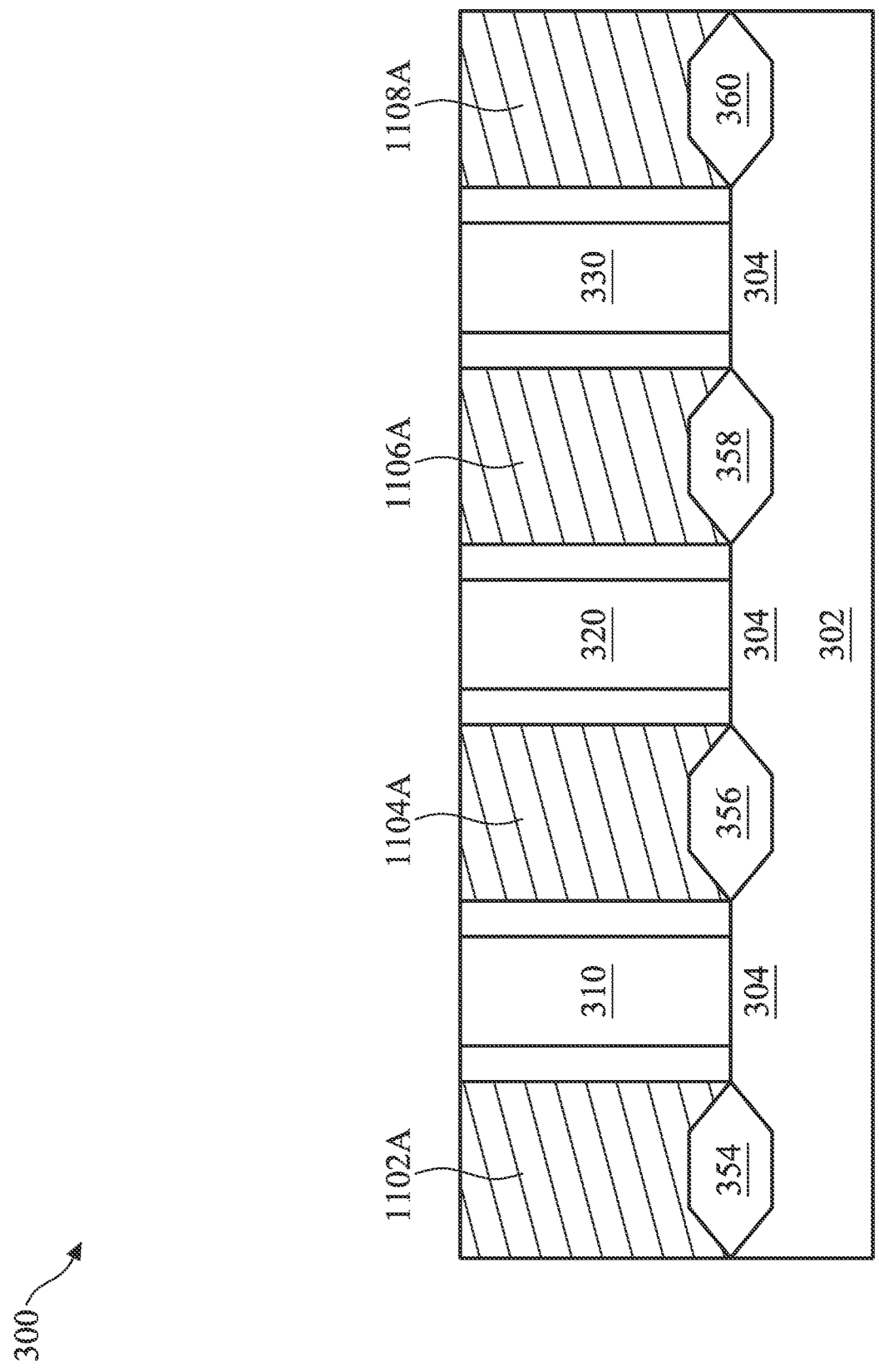
Figure 11C:
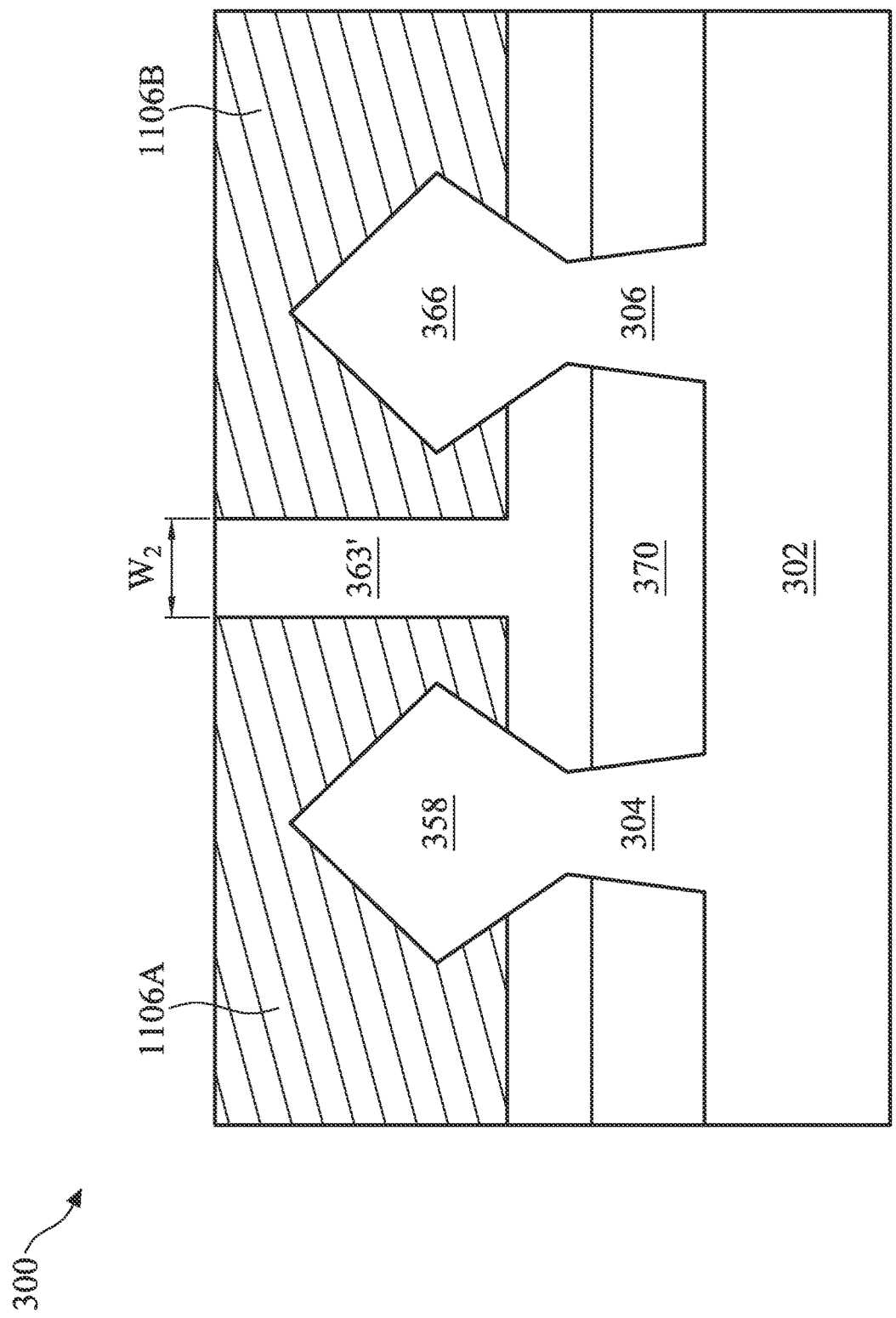

Corresponding to operation 218 of FIG. 2, FIG. 11A is a top view of the FinFET device 300 that includes interconnect structures 1102, 1104, 1106, and 1108 at one of the various stages of fabrication. FIGS. 11B and 11C illustrate corresponding cross-sectional view of FIG. 11A cut along cross-section A-A and cross-section B-B, respectively.

The interconnect structures 1102-1108 may be formed by filling the contact holes 1002-1008 with a metal material, followed by a CMP process to remove the sacrificial helmet structures 312-332 overlaying the active gate structures. The metal material may include tungsten (W), formed by a suitable method, such as PVD, CVD, electroplating, electroless plating, or the like. Besides tungsten, other material materials, such as copper (Cu), gold (Au), cobalt (Co), Ruthenium (Ru), combinations thereof, multi-layers thereof, alloys thereof, or the like, may also be used to form the interconnect structures 1102-1108.

As shown in FIGS. 11A-C, the interconnect structures 1102-1108 are formed to electrically couple to one or more respective source/drain structures. For example, the interconnect structure 1102 may electrically couple to the source/drain structures 354 and 362; a first portion of the interconnect structure 1104, 1104A, may electrically couple to the source/drain structure 356; a second portion of the interconnect structure 1104, 1104B, may electrically couple to the source/drain structure 364; a first portion of the interconnect structure 1106, 1106A, may electrically couple to the source/drain structure 358; a second portion of the interconnect structure 1106, 1106B, may electrically couple to the source/drain structure 366; and the interconnect structure 1108 may electrically couple to the source/drain structures 360 and 368. Such interconnect structures 1102-1108 may be part of a middle-end-of-line (MEOL) interconnection network, where such interconnect structures are sometimes referred to as "MDs."

In various embodiments, different portions of each of the interconnect structures 1104 and 1106 can be electrically isolated from each other by the dielectric spacing 363', which has a width of about $W_2$. In the existing technologies, the width of a dielectric spacing that electrically isolates two adjacent source/drain structures is typically subjected to various factors such as, for example, the limit of a patterning process, the corresponding patterned structure to define the dielectric spacing that tends to be peeled off in response to being reduced in dimensions, etc. By contrast, the methods, as disclosed herein, can trim the patterned structure (e.g., 406B) along only the direction where it intends to be (e.g., the direction along which two adjacent source/drain structures are desired to be spaced from each other). As such, the width of the dielectric spacing (e.g., 363') can be reduced, which in turn enlarges the width of each of the interconnect structures (e.g., 1106A and 1106B) disposed on the opposite sides of the dielectric spacing. The contact resistances of the interconnect structures can thus be advantageously reduced.

Although the embodiments of the present disclosure are directed to forming a trimmed dielectric spacing between two adjacent source/drain structures, it is understood that the embodiments is applicable to any of various other structures of a transistor device that are desired to be isolated or otherwise separated from each other, while remaining within the scope of the present disclosure. For example, the disclosed methods can be used to separate a poly gate structure, a metal gate structure, etc.

Figure 12:
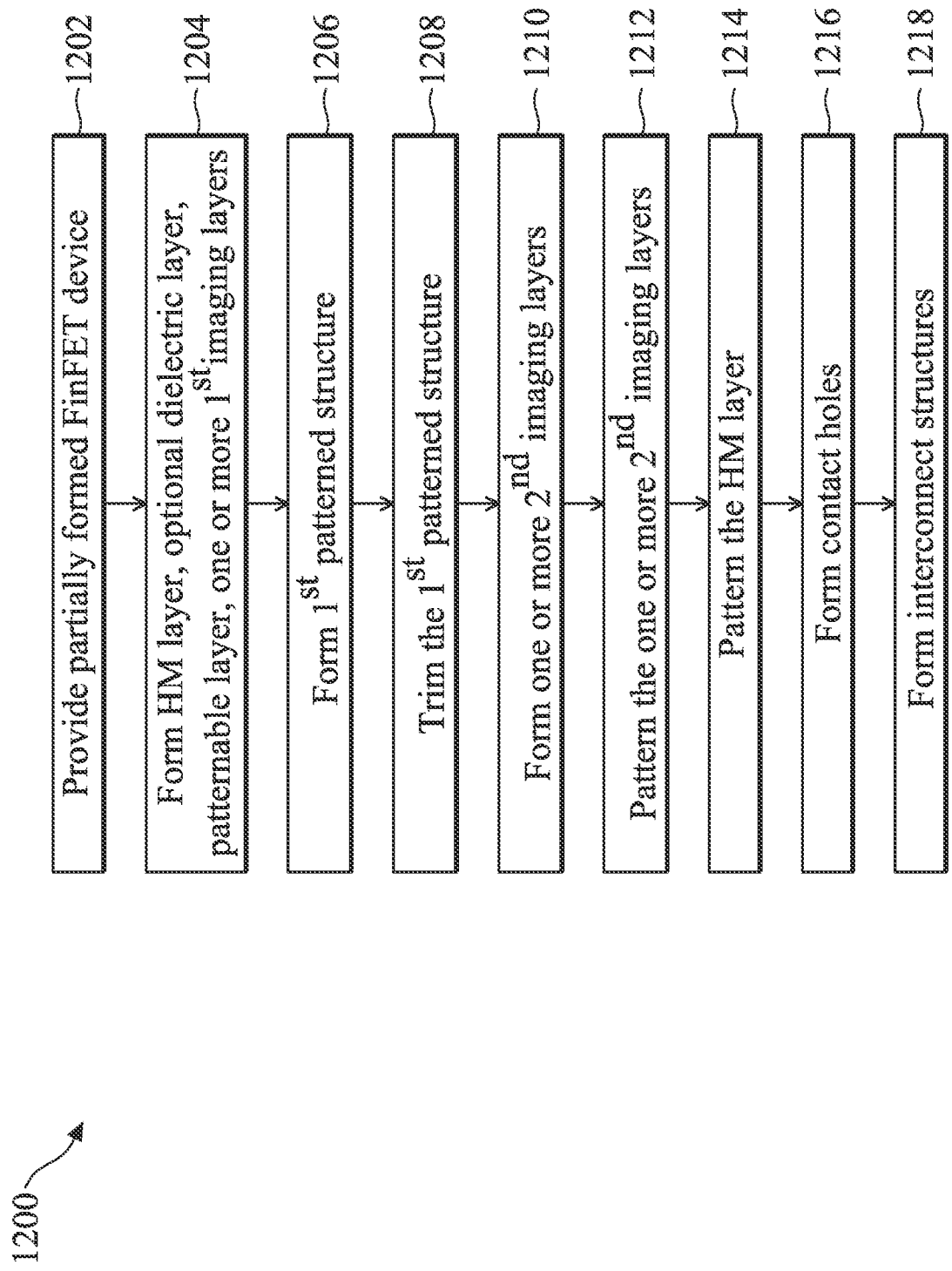
FIG. 12 illustrates a flow chart of another example method for making interconnect structures for a transistor device, in accordance with some embodiments.

FIG. 12 illustrates a flowchart of another method 1200 to form interconnect structures for a transistor device, according to one or more embodiments of the present disclosure. For example, at least some of the operations of the method 1200 can be used to form a FinFET device (e.g., FinFET device 300). It is noted that the method 1200 is merely an example, and is not intended to limit the present disclosure. Accordingly, it is understood that additional operations may be provided before, during, and after the method 1200 of FIG. 12.

In some embodiments, the method 1200 is substantially similar to the method 200 of FIG. 2 except that the method 1200 may include operation of trimming the first patterned structure, e.g., 406B, prior to the formation of second imaging layer(s), e.g., 602-606. Thus, the method 1200 is briefly described as follows.

The method 1200 starts with operation 1202 of providing a partially formed FinFET device. The method 1200 continues to operation 1204 of forming one or more first imaging layers that include a pattern for forming a first patterns structure. The method 1200 continues to operation 1206 of forming the first patterned structure. The method 1200 continues to operation 1208 of trimming the first patterned structure. The method 1200 continues to operation 1210 of forming one or more second imaging layers that include a pattern for forming interconnect structures. The method 1200 continues to operation 1212 of patterning the one or more second imaging layers. The method 1200 continues to operation 1214 of patterning the hard mask layer to form a second patterned structure. The method 1200 continues to operation 1216 of forming contact holes. The method 1200 continues to operation 1218 of forming the interconnect structures in the contact holes. In accordance with some embodiments, when forming the first patterned structure (e.g., at operation 1206), the first patterned structure may be formed to have a prolonged length along the lengthwise direction of the fins 304-306 to compensate possibly trimmed length during operation 1208.

Figure 13:
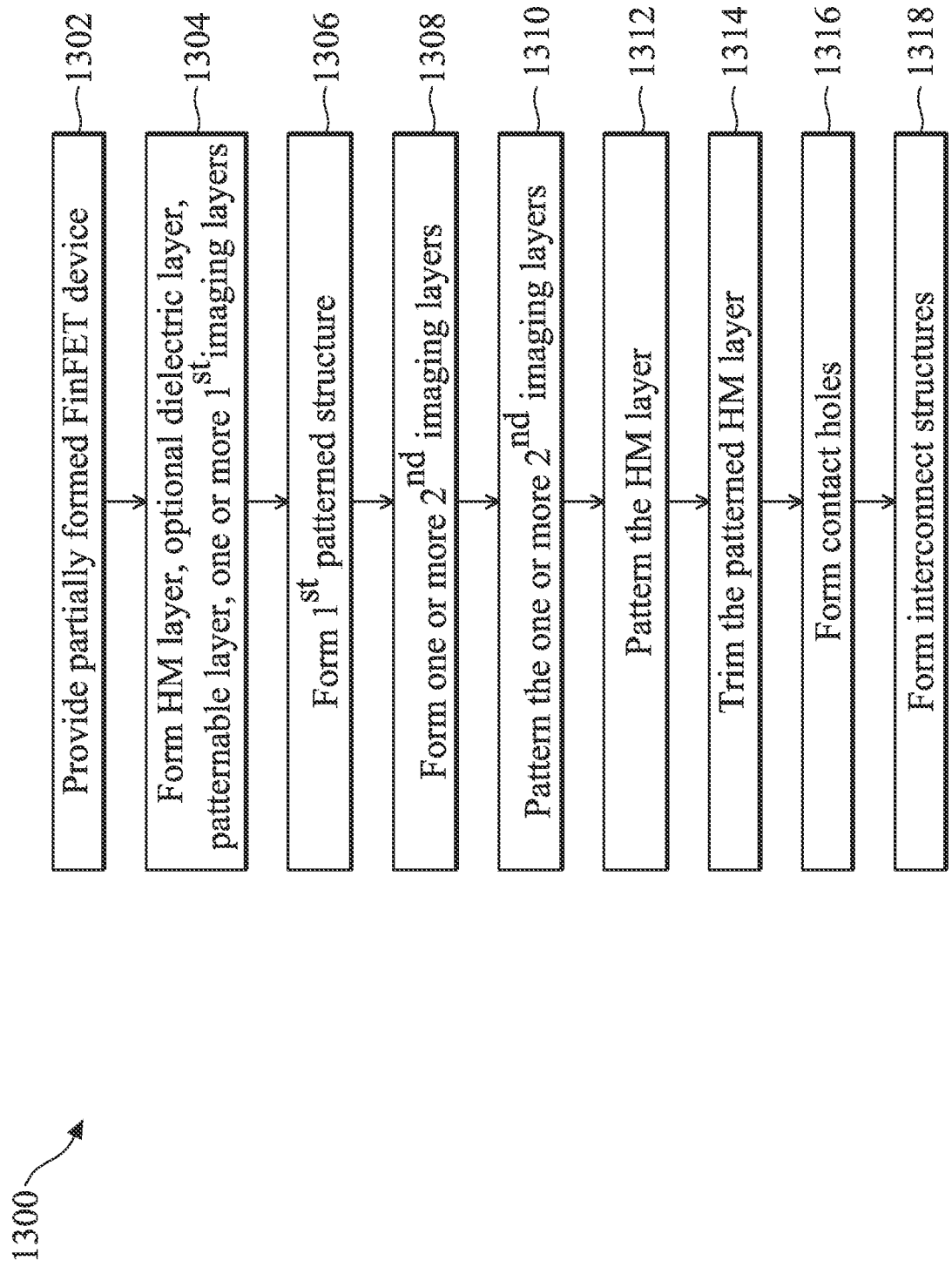
FIG. 13 illustrates a flow chart of yet another example method for making interconnect structures for a transistor device, in accordance with some embodiments.

FIG. 13 illustrates a flowchart of yet another method 1300 to form interconnect structures for a transistor device, according to one or more embodiments of the present disclosure. For example, at least some of the operations of the method 1300 can be used to form a FinFET device (e.g., FinFET device 300). It is noted that the method 1300 is merely an example, and is not intended to limit the present disclosure. Accordingly, it is understood that additional operations may be provided before, during, and after the method 1300 of FIG. 13.

In some embodiments, the method 1300 is substantially similar to the method 200 of FIG. 2 except that the method 1300 may include operation of trimming the second patterned structure, e.g., 402B, subsequently to its formation. Thus, the method 1300 is briefly described as follows.

The method 1300 starts with operation 1302 of providing a partially formed FinFET device. The method 1300 continues to operation 1304 of forming one or more first imaging layers that include a pattern for forming a first patterns structure. The method 1300 continues to operation 1306 of forming the first patterned structure. The method 1300 continues to operation 1308 of forming one or more second imaging layers that include a pattern for forming interconnect structures. The method 1300 continues to operation 1310 of patterning the one or more second imaging layers. The method 1300 continues to operation 1312 of patterning the hard mask layer to form a second patterned structure. The method 1300 continues to operation 1314 of trimming the second patterned structure. The method 1300 continues to operation 1316 of forming contact holes. The method 1300 continues to operation 1318 of forming the interconnect structures in the contact holes.

In one aspect of the present disclosure, a method for making a semiconductor device is disclosed. The method includes forming a first patterned structure over an interlayer dielectric. The interlayer dielectric overlays a first source/drain structure and a second source/drain structure. The first patterned structure extends along a first lateral direction and a vertical projection of the first patterned structure is located between the first and second source/drain structures along a second lateral direction perpendicular to the first lateral direction. The method includes reducing a width of the first patterned structure that extends along the second lateral direction. The method includes forming, based on the first patterned structure having the reduced width, contact holes that expose the first source/drain structure and the second source/drain structure, respectively.

In another aspect of the present disclosure, a method for making a semiconductor device is disclosed. The method includes forming an interlayer dielectric to overlay a first source/drain structure and a second source/drain structure. The method includes forming a first patterned structure over the interlayer dielectric. The first patterned structure extends along a first lateral direction and a vertical projection of the first patterned structure on the interlayer dielectric is located between the first and second source/drain structures along a second lateral direction perpendicular to the first lateral direction. The method includes trimming the first patterned structure, thereby causing a width of the first patterned structure that extends along the second lateral direction to be reduced. The method includes etching the interlayer dielectric to form contact holes that expose the first source/drain structure and the second source/drain structure, respectively, based on the trimmed first patterned structure such that widths of the contact holes along the second lateral direction are respectively enlarged.

In yet another aspect of the present disclosure, a method for making a semiconductor device is disclosed. The method includes forming an interlayer dielectric to overlay a first source/drain structure and a second source/drain structure that are separated from each other along a first lateral direction. The method includes forming a patterned structure over the interlayer dielectric. The patterned structure is located between the first and second source/drain structures along the first lateral direction. The method includes clamping end portions of the patterned structure located along a second lateral direction that is perpendicular to the first lateral direction. The method includes reducing a width of the patterned structure that extends along the first lateral direction. The method includes etching the interlayer dielectric to form contact holes that expose the first source/drain structure and the second source/drain structure, respectively, based on the patterned structure having the reduced width such that a distance between respective inner sidewalls of the contact holes, which are separated by the interlayer dielectric, is shrunk.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising:
  forming a first patterned structure over an interlayer dielectric, wherein the interlayer dielectric overlays a first source/drain structure and a second source/drain structure, and wherein the first patterned structure extends along a first lateral direction and a vertical projection of the first patterned structure is located between the first and second source/drain structures along a second lateral direction perpendicular to the first lateral direction;
  reducing a width of the first patterned structure that extends along the second lateral direction; and
  forming, based on the first patterned structure having the reduced width, contact holes that expose the first source/drain structure and the second source/drain structure, respectively.

2. The method of claim 1, wherein the method further comprises, prior to the step of reducing a width of the first patterned structure:
  depositing at least one imaging layer over the interlayer dielectric; and
  forming a trench in the at least one imaging layer that extends along the second lateral direction and exposes a central portion of the first patterned structure.

3. The method of claim 2, wherein the step of reducing a width of the first patterned structure comprises etching the central portion of the first patterned structure through the trench, while clamping end portions of the first patterned structure with the at least one imaging layer.

4. The method of claim 1, further comprising filling the contact holes with a metal material to form a first interconnect structure and a second interconnect structure that electrically connect to the first and second source/drain structures, respectively.

5. The method of claim 4, wherein the first and second interconnect structures are electrically isolated from each other by a portion of the interlayer dielectric that is vertically projected from the first patterned structure.

6. The method of claim 1, wherein the width of the first patterned structure is reduced by at least about 1 nanometer (nm).

7. The method of claim 1, wherein the method further comprises, following the step of reducing a width of the first patterned structure:
  depositing at least one imaging layer over the interlayer dielectric; and
  forming a trench in the at least one imaging layer that extends along the second lateral direction and exposes a central portion of the first patterned structure.

8. The method of claim 1, wherein the method further comprises, prior to the step of reducing a width of the first patterned structure:
  forming a second patterned structure over the interlayer dielectric, wherein the second patterned structure extends along the first lateral direction and a vertical projection of the second patterned structure is located between the first and second source/drain structures along the second lateral direction;
  depositing at least one imaging layer over the interlayer dielectric;
  forming a trench in the at least one imaging layer that extends along the second lateral direction and exposes a central portion of the second patterned structure; and
  forming the first patterned structure using the second patterned structure.

9. The method of claim 1, wherein the step of forming contact holes comprises etching the interlayer dielectric using a dry etching process that includes an etchant selected from the group consisting of: carbon tetrafluoride ($CF_4$), hexafluoro-1,3-butadiene ($C_4F_6$), octafluorocyclobutane ($C_4F_8$), and oxygen ($O_2$).

10. A method for making a semiconductor device, comprising:
  forming an interlayer dielectric to overlay a first source/drain structure and a second source/drain structure;
  forming a first patterned structure over the interlayer dielectric, wherein the first patterned structure extends along a first lateral direction and a vertical projection of the first patterned structure on the interlayer dielectric is located between the first and second source/drain structures along a second lateral direction perpendicular to the first lateral direction;
  trimming the first patterned structure, thereby causing a width of the first patterned structure that extends along the second lateral direction to be reduced; and
  etching the interlayer dielectric to form contact holes that expose the first source/drain structure and the second source/drain structure, respectively, based on the trimmed first patterned structure such that widths of the contact holes along the second lateral direction are respectively enlarged.

11. The method of claim 10, wherein the method further comprises, prior to the step of trimming the first patterned structure:
  depositing at least one imaging layer over the interlayer dielectric; and
  forming a trench in the at least one imaging layer that extends along the second lateral direction and exposes a central portion of the first patterned structure.

12. The method of claim 11, wherein the step of trimming the first patterned structure comprises etching the central portion of the first patterned structure through the trench, while clamping end portions of the first patterned structure with the at least one imaging layer.

13. The method of claim 10, further comprising filling the enlarged contact holes with a metal material to form a first interconnect structure and a second interconnect structure that electrically connect to the first and second source/drain structures, respectively.

14. The method of claim 13, wherein respective widths of the first and second interconnect structures are enlarged along the second lateral direction such that respective contact resistances of the first and second interconnect structures are reduced.

15. The method of claim 10, wherein the method further comprises, following the step of trimming the first patterned structure:
  depositing at least one imaging layer over the interlayer dielectric; and
  forming a trench in the at least one imaging layer that extends along the second lateral direction and exposes a central portion of the first patterned structure.

16. The method of claim 10, wherein the method further comprises, prior to the step of trimming the first patterned structure:

forming a second patterned structure over the interlayer dielectric, wherein the second patterned structure extends along the first lateral direction and a vertical projection of the second patterned structure is located between the first and second source/drain structures along the second lateral direction;

depositing at least one imaging layer over the interlayer dielectric;

forming a trench in the at least one imaging layer that extends along the second lateral direction and exposes a central portion of the second patterned structure; and forming the first patterned structure using the second patterned structure.

17. The method of claim 9, wherein the step of etching the interlayer dielectric comprises performing a dry etching process that includes an etchant selected from a group consisting of: carbon tetrafluoride ($CF_4$), hexafluoro-1,3-butadiene ($C_4F_6$), octafluorocyclobutane ($C_4F_8$), and oxygen ($O_2$).

18. A method for making a semiconductor device, comprising:

forming an interlayer dielectric to overlay a first source/drain structure and a second source/drain structure that are separated from each other along a first lateral direction;

forming a patterned structure over the interlayer dielectric, wherein the patterned structure is located between the first and second source/drain structures along the first lateral direction;

clamping end portions of the patterned structure located along a second lateral direction that is perpendicular to the first lateral direction;

reducing a width of the patterned structure that extends along the first lateral direction; and etching the interlayer dielectric to form contact holes that expose the first source/drain structure and the second source/drain structure, respectively, based on the patterned structure having the reduced width such that a distance between respective inner sidewalls of the contact holes, which are separated by the interlayer dielectric, is shrunk.

19. The method of claim 18, wherein the step of clamping end portions of the patterned structure further comprises:

depositing at least one imaging layer over the interlayer dielectric; and forming a trench in the at least one imaging layer that extends along the first lateral direction and exposes a central portion of the patterned structure, while clamping the end portions using a remaining portion of the at least one imaging layer.

20. The method of claim 18, wherein the width of the patterned structure is reduced by at least about 1 nanometer (nm).

* * * * *